(12) United States Patent
Tabata et al.

(10) Patent No.: US 10,559,472 B2
(45) Date of Patent: Feb. 11, 2020

(54) WORKPIECE PROCESSING METHOD

(71) Applicant: TOKYO ELECTRON LIMITED, Tokyo (JP)

(72) Inventors: Masahiro Tabata, Miyagi (JP); Toru Hisamatsu, Miyagi (JP); Yoshihide Kihara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/111,622

(22) Filed: Aug. 24, 2018

(65) Prior Publication Data
US 2019/0067019 A1 Feb. 28, 2019

(30) Foreign Application Priority Data
Aug. 25, 2017 (JP) .................. 2017-162600

(51) Int. Cl.
| | | |
|---|---|---|
| H01L 21/3065 | (2006.01) | |
| H01J 37/32 | (2006.01) | |
| H01L 21/308 | (2006.01) | |
| H01L 21/683 | (2006.01) | |

(52) U.S. Cl.
CPC ...... *H01L 21/3065* (2013.01); *H01J 37/3211* (2013.01); *H01J 37/32458* (2013.01); *H01J 37/32724* (2013.01); *H01L 21/3088* (2013.01); *H01L 21/6833* (2013.01); *H01J 2237/3341* (2013.01); *H01J 2237/3344* (2013.01)

(58) Field of Classification Search
CPC ............. G02B 6/0031; G02F 1/133615; H01J 2237/3341; H01J 2237/3344; H01J 37/3211; H01J 37/32458; H01J 37/32724; H01L 21/3065; H01L 21/3088; H01L 21/67109; H01L 21/6831; H01L 21/6833
USPC ....... 438/706, 710, 712, 714, 719, 723, 756, 438/758, 787
See application file for complete search history.

(56) References Cited

U.S. PATENT DOCUMENTS

| | | | | |
|---|---|---|---|---|
| 2002/0000422 | A1* | 1/2002 | Donohoe | H01J 37/321 216/64 |
| 2007/0232071 | A1* | 10/2007 | Balseanu | H01L 21/31116 438/694 |
| 2007/0243693 | A1* | 10/2007 | Nemani | H01L 21/76224 438/424 |
| 2011/0256726 | A1* | 10/2011 | LaVoie | C23C 16/045 438/702 |
| 2016/0379824 | A1 | 12/2016 | Wise et al. | |

* cited by examiner

*Primary Examiner* — Lan Vinh
(74) *Attorney, Agent, or Firm* — Rothwell, Figg, Ernst & Manbeck, P.C.

(57) ABSTRACT

An embodiment of the present disclosure provides a method of processing a workpiece in which a plurality of holes are formed on a surface of the workpiece. The method includes a first sequence including a first process of forming a film with respect to an inner surface of each of the holes and a second process of isotropically etching the film. The first process includes a film forming process using a plasma CVD method, and the film contains silicon.

18 Claims, 17 Drawing Sheets

WORKPIECE PROCESSING METHOD

CROSS-REFERENCE TO RELATED APPLICATION

This application is based on and claims priority from Japanese Patent Application No. 2017-162600, filed on Aug. 25, 2017 with the Japan Patent Office, the disclosure of which is incorporated herein in its entirety by reference.

TECHNICAL FIELD

The present disclosure relates to a method of processing a workpiece.

BACKGROUND

In an electronic device manufacturing process, a mask is formed on a processing target layer, and etching is performed to transfer a pattern of the mask to the processing target layer. As an example of such an etching, plasma etching may be used. The masks used for plasma etching are formed by the photolithographic technique. Therefore, a limit dimension of the pattern formed on the processing target layer depends on a resolution of the mask formed by the photolithographic technique. The resolution of the pattern of the mask has a resolution limit. There is a growing demand for high integration of an electronic device and it is required to form a pattern having a dimension smaller than the resolution limit. For this reason, as disclosed in, for example, U.S. Patent Application Publication No. 2016/0379824, a technique has been proposed in which the dimensional shape of the pattern is adjusted to reduce the width of an opening of the pattern.

SUMMARY

In an aspect of the present disclosure, a method of processing a workpiece is provided. A plurality of holes are provided on the surface of the workpiece. This method has a first sequence that includes a first process of forming a film on the inner surface of a hole and a second process of isotropically etching the film. The first process includes a film forming process using a plasma CVD method, and the film contains silicon.

The foregoing summary is illustrative only and is not intended to be in any way limiting. In addition to the illustrative aspects, exemplary embodiments, and features described above, further aspects, exemplary embodiments, and features will become apparent by reference to the accompanying drawings and the following detailed description.

DETAILED DESCRIPTION

Figure 1:
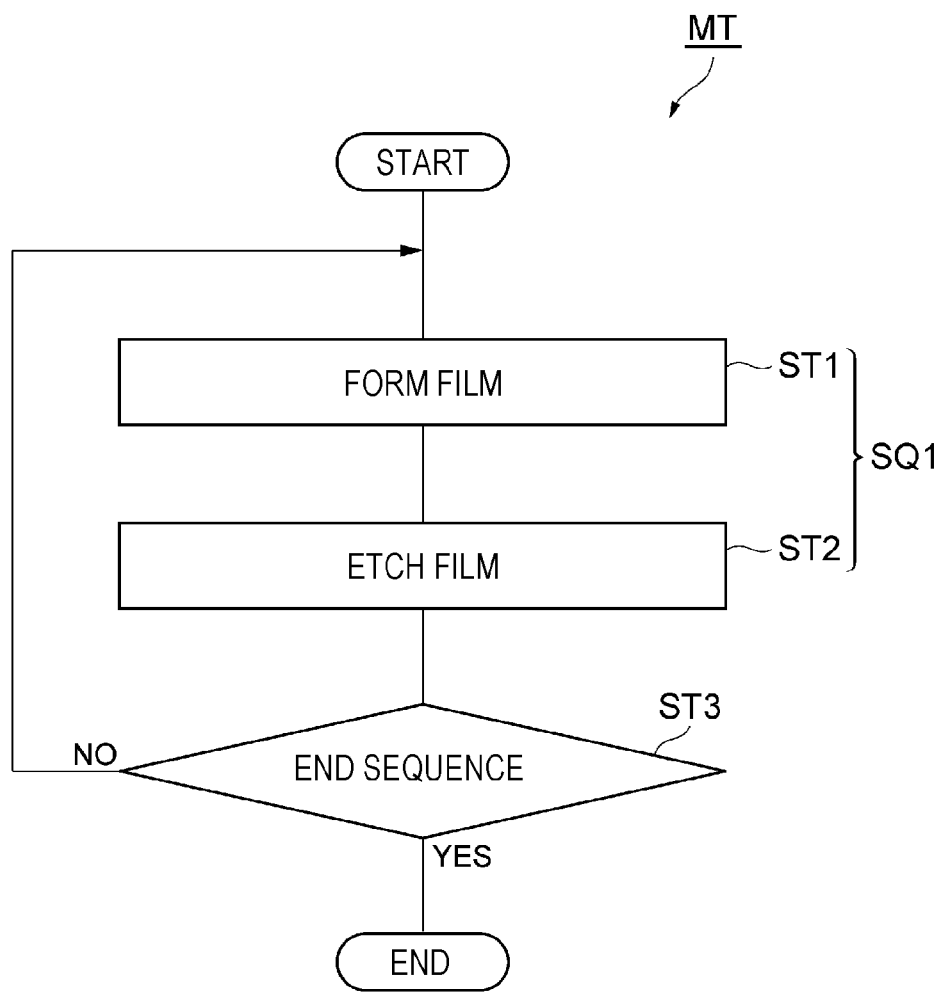
FIG. 1 is a flow chart illustrating a portion of a method according to an embodiment.

In the following detailed description, reference is made to the accompanying drawings, which form a part thereof. The illustrative exemplary embodiments described in the detailed description, drawings, and claims are not meant to be limiting. Other exemplary embodiments may be utilized, and other changes may be made without departing from the spirit or scope of the subject matter presented here.

Pattern formation may be achieved by forming a highly detailed hole with respect to a processing target layer such as, for example, a $SiO_2$ layer. When forming a pattern that has a dimension smaller than the resolution limit of the mask pattern, it is required to control a very detailed minimum line width (CD: critical dimension) of the pattern hole. As the pattern becomes more detailed, the influence of the minimum line width variation becomes greater. In particular, in the case of an extreme ultra violet (EUV) lithography, the initial local CD uniformity (LCDU) may decrease. Therefore, in the pattern formation on a workpiece having a processing target layer such as, for example, $SiO_2$, it is desired to implement a method of suppressing the minimum line width variation to a high precision in order to achieve minimization due to high integration.

In an aspect of the present disclosure, a method of processing a workpiece is provided. A plurality of holes are provided on the surface of the workpiece. This method has a first sequence that includes a first process of forming a film on the inner surface of a hole and a second process of isotropically etching the film. The first process includes a film forming process using a plasma CVD method, and the film contains silicon.

In the above-described method, since the first process includes a film forming process that uses a plasma-enhanced chemical vapor deposition (CVD) method, a film having a relatively thin film thickness is formed with respect to a hole having a relatively narrow hole width and a film having a relatively thick film thickness is formed with respect to a hole having a relatively wide hole width. Therefore, even when the hole width varies in a plurality of holes, the variation may be reduced by the film forming process in the first process. Further, in the second process, since the film formed by the first process is isotropically etched, the film formed by the first process maintains a state in which the hole width variation is reduced, while adjusting the hole width.

According to an embodiment, a first sequence is repeatedly executed.

Since the first sequence is repeatedly executed in this manner, a film having the desired film thickness may be finally formed by forming a film having a relatively thin film thickness in the first process and repeatedly executing the first sequence. Thus, it is possible to sufficiently avoid the situation where the opening of a hole having a relatively narrow hole width is occluded by the film formed by the first process.

According to the embodiment, in the second process, the film is isotropically etched by removing the film for each atomic layer by executing a second sequence that includes: a third process of generating plasma of a first gas within a processing container of a plasma processing apparatus in which a workpiece is accommodated, and isotropically forming a mixed layer that includes an ion included in the plasma of the first gas in the atomic layer of the inner surface of the hole; a fourth process of purging a space within the processing container after executing the third process; a fifth process of generating plasma of a second gas within the processing container and removing the mixed layer by radicals included in the plasma of the second gas after executing the fourth process; and a sixth process of purging the space within the processing container after executing the fifth process. The first gas includes nitrogen, the second gas includes fluorine, and the plasma of the second gas generated in the fifth process includes the radial that removes the mixed layer including a silicon nitride. In this manner, after the surface of the film formed by the first process is isotropically modified by a method which is the same as the atomic layer etching (ALE) method, and the mixed layer is isotropically formed on the surface of the film, the mixed layer is entirely removed. Thus, the film formed in the first process may be isotropically and uniformly removed by the etching performed in the second process.

According to the embodiment, the second gas may be a mixed gas that includes $NF_3$ gas or $O_2$ gas, a mixed gas that includes $NF_3$ gas, $O_2$ gas, $H_2$ gas, and Ar gas, or a mixed gas that includes $CH_3F$ gas, $O_2$ gas, and Ar gas. Thus, a second gas containing fluorine may be implemented.

According to the embodiment, the film includes a first film and a second film, and the first process includes: a seventh process of forming the first film on the inner surface of the hole; and an eighth process of forming the second film on the first film. An etching resistance for etching performed in the second process is lower in the first film side than the second film side.

Even when the second film is removed in the second process from the hole where the film having a relatively thin film thickness is formed in the first process due to a relatively narrow hole width (referred to as a first hole), at this time point, a portion of the second film may remain in the hole where the film having a relatively thick film thickness is formed in the first process due to a relatively wide hole width (referred to as a second hole). When the etching in the second process is continuously performed from this state, since the etching resistance of the first film is lower than the etching resistance of the second film, the etching proceeds more quickly in the first hole side than the second hole side. Therefore, it is possible to more effectively reduce the variation in the hole width between the first hole and the second hole using the first film having a relatively low etching resistance and the second film having a relatively high etching resistance.

According to the embodiment, in the seventh process, the first film is formed by repeatedly executing a third sequence that includes: a ninth process of supplying a third gas to a processing container of a plasma processing apparatus in which the workpiece is accommodated; a tenth process of purging a space within the processing container after executing the ninth process; an eleventh process of generating plasma of a fourth gas within the processing container after executing the tenth process; and a twelfth process of purging the space within the processing container after executing the eleventh process. The second film is formed using a plasma CVD in the eighth process, the third gas includes an aminosilane-based gas, the fourth gas includes a gas containing an oxygen atom, and plasma of the third gas is not generated in the ninth process. Thus, since the first film is formed by the same method as the atomic layer deposition (ALD) method, the first film having a relatively thin film thickness may be formed in a conformal manner in the seventh process. Therefore, even when the second film is formed by the plasma CVD method, the entire thickness of the film including the first film and the second film may be effectively controlled.

According to the embodiment, the third gas includes monoaminosilane. Thus, the reaction precursor of silicon may be formed using a third gas including monoaminosilane.

According to the embodiment, the aminosilane-based gas of the third gas may include aminosilance having one to three silicon atoms. The aminosilane-based gas of the third gas may include aminosilane having one to three amino groups. In this manner, the aminosilane-based gas of the third gas may use aminosilane having one to three silicon atoms. Further, aminosilane having one to three amino groups may be used as the aminosilane-based gas of the third gas.

In another aspect of the present disclosure, a method of processing a workpiece is provided. A plurality of holes are provided on the surface of the workpiece. The method includes a first sequence that includes: a first process of forming a film with respect to an inner surface of each of the holes using a plasma CVD; and a second process of isotropically etching the film. The film includes a first film and a second film on the first film, and an etching resistance for etching performed in the second process is lower in a first film than a second film.

According to another embodiment, each of the first and second films may be any one of a silicon-containing film, a boron-containing film, a metal film, and a carbon-containing film.

As described above, there is provided a method of suppressing the minimum line width variation to a high precision in the pattern formation on a workpiece.

Figure 2:
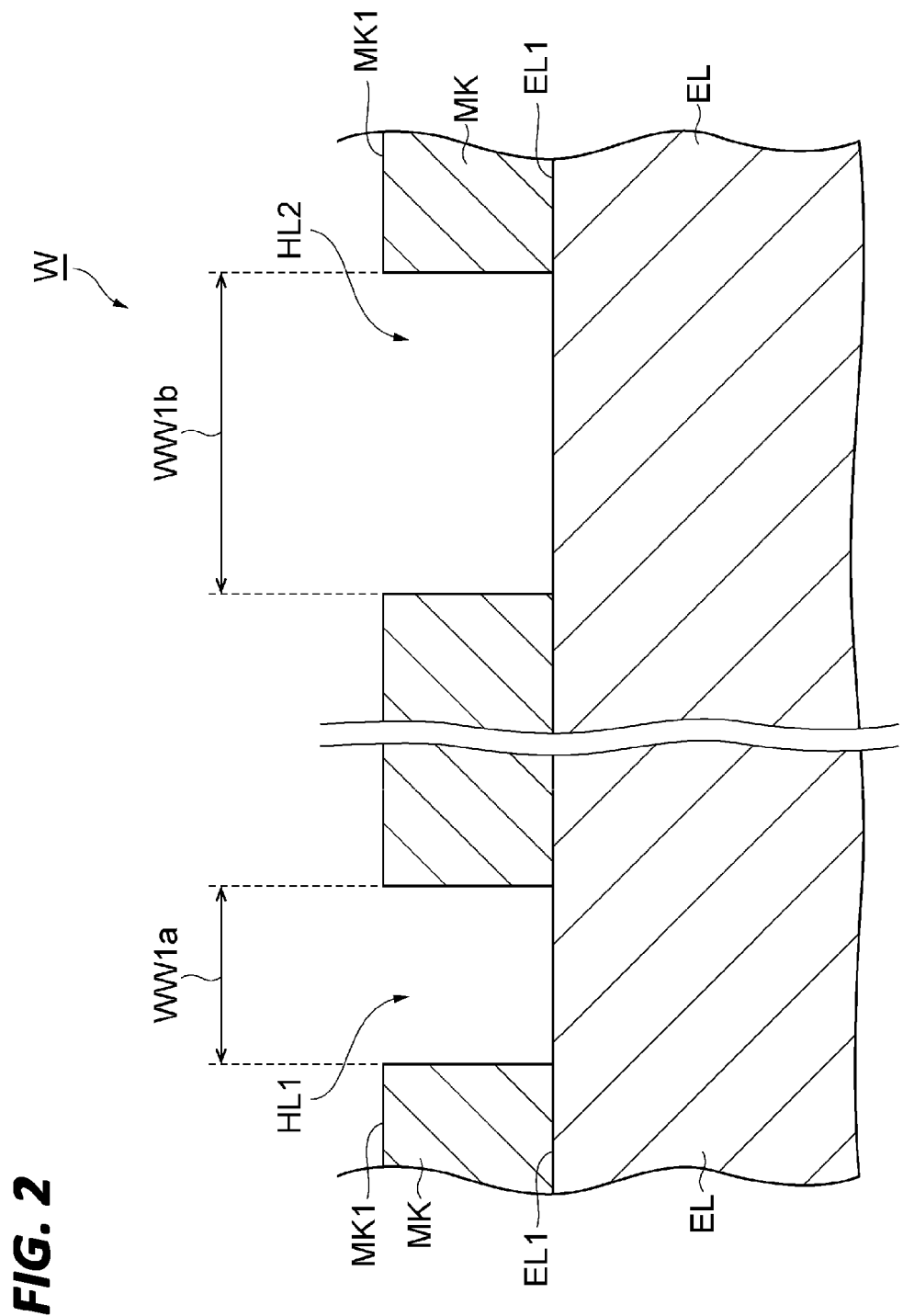
FIG. 2 is a cross-sectional view illustrating a workpiece to which the method illustrated in FIG. 1 is applied.

Hereinafter, various embodiments will be described in detail with reference to the accompanying drawings. The same or equivalent portions are denoted by the same reference numerals in each drawing. FIG. 1 is a flow chart illustrating a portion of the method according to the embodiment (hereinafter, referred to as a "method MT"). The method MT illustrated in FIG. 1 is an embodiment of a method of processing a workpiece (hereinafter, referred to as a "wafer W"). FIG. 2 is a cross-sectional view illustrating the wafer W to which the method MT illustrated in FIG. 1 is applied.

The wafer W illustrated in FIG. 2 includes a processing target layer EL, a mask MK formed on the processing target layer EL (the surface EL1 of the processing target layer EL), and a hole formed in the mask MK. (The hole is, e.g., a hole HL1 and a hole HL2. In the present embodiment, other similar shapes such as a hole, a pit, a depression, and a recess may be included.) In the wafer W, a plurality of holes are formed on the surface of the wafer W. In the present embodiment, the hole is formed in the mask MK, but the present disclosure is not limited to a configuration in which the holes are formed in the mask MK.

The processing target layer EL is, for example, a Si antireflection film, that is, an anti-reflection coating (SiARC) film. The material of the mask MK includes a resist according to the embodiment. In the mask MK, a hole of a pattern that provides an opening (which is equivalent to a hole formed on the surface of the wafer W) is formed by photolithography. The hole of the mask MK is formed substantially over the entire surface of the wafer W. The holes HL1 and HL2 of the wafer W illustrated in FIG. 2 have different hole widths. The hole HL1 has a hole width WW1$a$ and the hole HL2 has a hole width WW1$b$. In the holes HL1 and HL2 illustrated in FIG. 2, the value of the hole width WW1$a$ is smaller than the value of the hole width WW1$b$.

Figure 3:
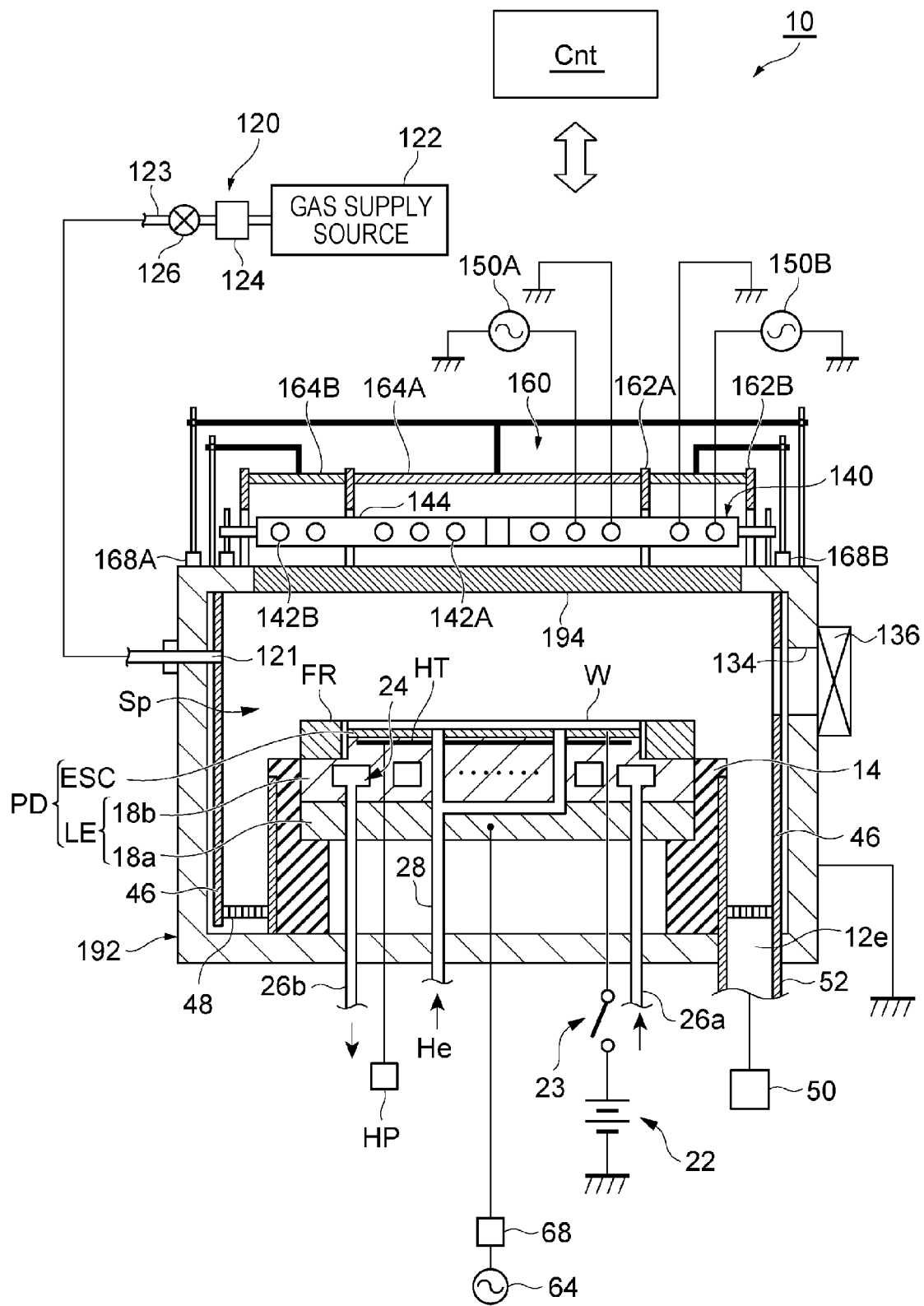
FIG. 3 illustrates an example of a plasma processing apparatus that may be used to execute the method illustrated in FIG. 1.

The method MT (method of processing the workpiece) is executed by a plasma processing apparatus 10. FIG. 3 illustrates an example of the plasma processing apparatus that may be used to execute the method illustrated in FIG. 1. FIG. 3 schematically illustrates a cross-sectional structure of the plasma processing apparatus 10 that may be used in various embodiments of the method MT of processing the wafer W. The plasma processing apparatus 10 illustrated in FIG. 3 includes an inductively coupled plasma (ICP) type plasma source. The plasma processing apparatus 10 includes a processing container 192 that is formed in a cylindrical shape (e.g., a cylindrical shape according to the embodiment) made of metal (e.g., aluminum according to the embodiment). The processing container 192 defines a processing space Sp in which the plasma processing is performed. The shape of the processing container 192 is not limited to a cylindrical shape, and may be a rectangular shape such as a box shape according to the embodiment. The plasma source of the plasma processing apparatus 10 is not limited to an ICP type, and may be, for example, an electron cyclotron resonance (ECR) type, a capacitively coupled plasma (CCP) type, or a microwave type.

A pedestal PD which places the wafer W is provided in a bottom portion of the processing container 192. The pedestal D includes an electrostatic chuck ESC and a lower electrode LE. The lower electrode LE includes a first plate 18$a$ and a second plate 18$b$. The processing container defines the processing space Sp.

A support 14 is provided in the bottom portion of the processing container 192 inside the processing container 192. According to the embodiment, the support 14 has, for example, a substantially cylindrical shape. The support 14 is made of, for example, an insulating material according the embodiment. The insulating material constituting the support 14 may include oxygen such as quartz. The support 14 extends from the bottom portion of the processing container 192 in the vertical direction in the processing container 192 (the direction toward the surface of the wafer W placed on the electrostatic chuck ESC from the ceiling side of the processing container 192 (specifically, e.g., on a plate-like dielectric side 194)).

The pedestal PD is placed in the processing container 192. The pedestal PD is supported by the support 14. The pedestal PD holds the wafer W on the top surface of the pedestal PD. The wafer W is a workpiece. The pedestal PD includes a lower electrode LE and an electrostatic chuck ESC.

The lower electrode LE includes a first plate 18$a$ and a second plate 18$b$. The first plate 18$a$ and the second plate 18$b$ are made of metal, for example, aluminum according to the embodiment. The first plate 18$a$ and the second plate 18$b$ have, for example, a substantially disk shape according to the embodiment. The second plate 18$b$ is provided on the first plate 18$a$. The second plate 18$b$ is electrically connected to the first plate 18$a$.

The electrostatic chuck ESC is provided on the second plate 18$b$. The electrostatic chuck ESC has a structure in which electrodes of a conductive film are disposed between a pair of insulating layers or between a pair of insulating sheets. A direct current power supply 22 is electrically connected to the electrode of the electrostatic chuck ESC via a switch 23. The electrostatic chuck ESC sucks the wafer W by the electrostatic force generated by the direct current voltage from the direct current power supply 22. As a result, the electrostatic chuck ESC may hold the wafer W.

A focus ring FR is arranged on the periphery of the second plate 18$b$ so as to surround the edge of the wafer W and the electrostatic chuck ESC. The focus ring FR is provided to improve the uniformity of the etching. The focus ring FR is made of materials appropriately selected depending on the material of the film to be etched, and may be made of, for example, quartz according to the embodiment.

A coolant flow path 24 is provided inside the second plate 18$b$. The coolant flow path 24 constitutes a temperature control mechanism. A coolant is supplied to the coolant flow path 24 from a chiller unit provided outside the processing container 12 via a pipe 26$a$. The coolant supplied to the coolant flow path 24 is returned to the chiller unit via the pipe 26$b$. In this manner, the coolant is supplied to the coolant flow path 24 so that the coolant circulates. By controlling the temperature of the coolant, the temperature of the wafer W supported by the electrostatic chuck ESC is controlled. According to the embodiment, a gas supply line 28 supplies a heat transfer gas, for example, He gas from a heat transfer gas supply mechanism between the top surface of the electrostatic chuck ESC and the back surface of the wafer W.

The plasma processing apparatus 10 is provided with a temperature controller HT that adjusts the temperature of the wafer W. The temperature controller HT is built in the electrostatic chuck ESC. A heater power supply HP is connected to the temperature controller HT. By supplying power to the temperature controller HT from the heater power supply HP, the temperature of the electrostatic chuck ESC is adjusted and the temperature of the wafer W displaced on the electrostatic chuck ESC is adjusted. The temperature controller HT may be embedded in the second plate 18$b$.

The temperature controller HT includes a plurality of heating elements that generate heat and a plurality of temperature sensors that detect temperatures of the respective surroundings of the plurality of heating elements.

The plate-like dielectric 194 is disposed above the pedestal PD to face the pedestal PD. The lower electrode LE and the plate-like dielectric 194 are provided substantially in parallel with each other. A processing space Sp is provided between the plate-like dielectric 194 and the lower electrode LE. The processing space Sp is a spatial region that performs a plasma processing on the wafer W.

In the plasma processing apparatus 10, a deposit shield 46 is provided so as to be detachable along the inner wall of the processing container 12. The deposit shield 46 is also provided on the outer periphery of the support 14. The deposit shield 46 suppresses an etching by-product (deposit) from being attached to the processing container 12 and may be constituted by coating an aluminum material with ceramics such as $Y_2O_3$. In addition to $Y_2O_3$, the deposit shield may be made of a material including, for example, quartz, according to the embodiment.

An exhaust plate 48 is provided on the bottom portion of the processing container 192 and between the support 14 and the side wall of the processing container 192. The exhaust plate 48 may be constituted, for example, by coating an aluminum material with ceramics such as $Y_2O_3$. An exhaust port 12e is provided below the exhaust plate 48 in the processing container 12. An exhaust device 50 is connected to the exhaust port 12e via an exhaust pipe 52. The exhaust device 50 has a vacuum pump such as a turbo molecular pump so that the space in the processing container 12 may be reduced to a desired degree of vacuum. A high-frequency power source 64 is a power source that generates a high-frequency power for drawing ions into the wafer W, that is, a high-frequency bias power, and generates a high-frequency bias power having a frequency within the range of 400 kHz to 40.68 MHz, for example, 13 MHz. The high-frequency power source 64 is connected to the lower electrode LE via a matching device 68. The matching device 68 is a circuit that matches an output impedance of the high-frequency power source 64 with an input impedance of a load side (lower electrode LE side).

In a ceiling portion of the processing container 192, the plate-like dielectric 194 made of, for example, quartz glass or ceramics is provided so as to face the pedestal PD according to the embodiment. Specifically, according to the embodiment, the plate-like dielectric 194 is formed, for example, in a disk shape and is hermetically attached so as to close an opening formed in the ceiling portion of the processing container 192. The processing space Sp is a space in which plasma is generated by a plasma source. The processing space Sp is a space in which the wafer W is placed.

The processing container 192 is provided with a gas supply unit 120 that supplies a plurality of types of processing gases (e.g., processing gases G1 to G8 described below according to the embodiment). The gas supply unit 120 supplies various processing gases to the processing space Sp described above. A gas introduction port 121 is formed in the side wall of the processing container 192, and a gas supply source 122 is connected to the gas introduction port 121 via a gas supply pipe 123. A flow controller (e.g., a mass flow controller 124 and an open/close valve 126) is provided in the middle of the gas supply pipe 123 to control the flow rate of various processing gases. With such a gas supply unit 120, various processing gases output from the gas supply source 122 are controlled at the flow rate set in advance by the mass flow controller 124, and are supplied from the gas introduction port 121 to the processing space Sp of the processing container 192.

In FIG. 3, for simplicity of description, the gas supply unit 120 is represented by a single gas line, but the gas supply unit 120 is configured to supply a plurality of gas species. The gas supply unit 120 illustrated in FIG. 3 is configured to supply gas, for example, from the side wall of the processing container 192. However, the gas supply unit 120 is not limited to the configuration illustrated in FIG. 3. For example, the gas supply unit 120 may be configured to supply gas from the ceiling portion of the processing container 192. When the gas supply unit 120 has such a configuration, for example, a gas introduction port may be formed at the central portion of the plate-like dielectric 194, and the gas may be supplied from the gas introduction port.

An exhaust device 50 that exhausts the atmosphere in the processing container 192 is connected to the bottom portion of the processing container 192 via an exhaust pipe 52. The exhaust device 50 is constituted by, for example, a vacuum pump, and the pressure in the processing container 192 may be set to a preset pressure.

A wafer carry-in/carry-out port 134 is formed on the side wall of the processing container 192, and a gate valve 136 is provided on the wafer carry-in/carry-out port 134. For example, when the wafer W is carried in, the gate valve 136 is opened. After the wafer W is placed on the pedestal PD in the processing container 192 by a transfer mechanism such as a transfer arm (not illustrated), the gate valve 136 is closed and the processing of the wafer W is started.

A planar high-frequency antenna 140 and a shield member 160 that covers the high-frequency antenna 140 are provided on the top side surface (outer side surface) of the plate-like dielectric 194 on the ceiling portion of the processing container 192. The high-frequency antenna 140 according to the embodiment includes an inner antenna element 142A disposed in the central portion of the plate-like dielectric 194 and an outer antenna element 142B disposed to surround the outer periphery of the inner antenna element 142A. Each of the inner antenna element 142A and the outer antenna element 142B is a conductor such as copper, aluminum, or stainless steel according to the embodiment, and has a spiral coil shape.

The inner antenna element 142A and the outer antenna element 142B are both sandwiched by a plurality of pinching members 144 and are integrated with each other. The pinching member 144 has, for example, a rod shape according to the embodiment. The pinching member 144 is disposed radially so as to protrude from the center of the inner antenna element 142A to the outside of the outer antenna element 142B.

The shield member 160 includes an inner shield wall 162A and an outer shield wall 162B. The inner shield wall 162A is provided between the inner and outer antenna elements 142A and 142B so as to surround the inner antenna element 142A. The outer shield wall 162B is provided so as to surround the outer antenna element 142B, and has a cylindrical shape. Therefore, the top side surface of the plate-like dielectric 194 is divided into a central portion on the inside of the inner shield wall 162A (central zone) and a peripheral portion between the inner shield wall 162A and the outer shield wall 162B (peripheral zone).

A disk-shaped inner shield plate 164A is provided on the inner antenna element 142A to block the opening of the inner shield wall 162A. An outer shield plate 164B having a donut plate shape is provided on the outer antenna element 142B so as to block the opening between the inner shield wall 162A and the outer shield wall 162B.

The shape of the shield member 160 is not limited to a cylindrical shape. The shape of the shield member 160 may be, for example, a rectangular shape or the like according to the embodiment, or may be matched to the shape of the processing container 192. Here, since the processing container 192 has, for example, a substantially cylindrical shape according to the embodiment, the shield member 160 also has a substantially cylindrical shape corresponding to the cylindrical shape. When the processing container 192 has a substantially rectangular shape, the shield member 160 also has a substantially rectangular shape.

A high-frequency power source 150A and a high-frequency power source 150B are connected to the inner antenna element 142A and the outer antenna element 142B, respectively. Thus, a high frequency having the same frequency or different frequency may be applied to each of the inner and outer antenna elements 142A and 142B. For example, when a high frequency power having a frequency, for example, 27 MHz is supplied from the high-frequency power source 150A to the inner antenna element 142A at a preset power W according to the embodiment, the gas introduced into the processing container 192 is excited by the induction magnetic field formed in the processing container 192, and donut shape plasma may be generated in the central portion of the wafer W. In addition, when a high frequency power having a frequency, for example, 27 MHz is supplied from the high-frequency power source 150B to the outer antenna element 142B at a preset power W according to the embodiment, the gas introduced into the processing container 192 is excited by the induction magnetic field formed in the processing container 192, and donut shape plasma may be generated in the peripheral portion of the wafer W. The high frequencies output from each of the high-frequency power source 150A and the high-frequency power source 150B are not limited to the above-described frequencies, but various frequencies may be supplied from each of the high-frequency power source 150A and the high-frequency power source 150B. It is necessary to adjust the electrical lengths of the inner and outer antenna elements 142A and 142B in accordance with the high frequency output from each of the high-frequency power source 150A and the high-frequency power source 150B. In each of the inner shield plate 164A and the outer shield plate 164B, the height may be adjusted separately by an actuator 168A and an actuator 168B.

A controller Cnt is a computer that includes a processor, a storage unit, an input device, a display device, and the like, and controls the respective portions of the plasma processing apparatus 10 which will be described later. The controller Cnt is connected to a mass flow controller 124, an open/close valve 126, a high-frequency power source 150A, a high-frequency power source 150B, a direct current power supply 22, a switch 23, an exhaust device 50, a high-frequency power source 64, a matching device 68, an electrostatic chuck ESC, a heater power supply HP, a chiller unit, or the like. The controller Cnt operates in accordance with a computer program that controls the respective portions of the plasma processing apparatus 10 in the respective steps of the method MT (a program based on the input recipe), and sends out a control signal. The respective portions of the plasma processing apparatus 10 are controlled by a control signal from the controller Cnt. The controller Cnt may control the selection and flow rate of the gas supplied from the gas supply source 122, the exhaust of the exhaust device 50, the power supply from the high-frequency power sources 150A and 150B, the power supply from the high-frequency power source 64, the power supply from the heater power supply HP, the flow rate and temperature of the coolant from the chiller unit, or the like, for example, by the control signal from the controller Cnt. The respective steps of the method MT disclosed in the present specification may be executed by operating each portion of the plasma processing apparatus 10 by control by the controller Cnt. A computer program that executes the method MT and various data used to execute the method MT are stored in the storage unit of the controller Cnt in a readable manner.

Referring back to FIG. 1, the method MT will be described in detail, taking an example of a form implemented in a processing system 1 provided with the plasma processing apparatus 10. The method MT is a processing method of adjusting the variation of the hole width (a method of processing the workpiece). The method MT may also be executed on another plasma processing apparatus different from the plasma processing apparatus 10. The method MT includes a sequence SQ1 and a step ST3 as illustrated in FIG. 1. The sequence SQ1 includes a step ST1 (first step) and a step ST2 (second step). First, the wafer W is carried into the processing container 192 of the plasma processing apparatus 10 before the execution of the step ST1, and the wafer W carried into the processing container 192 of the plasma processing apparatus 10 is positioned and placed onto the electrostatic chuck ESC.

In the step ST1, a film is formed on the inner surface of the hole on the surface of the wafer W. The step ST1 includes a film forming process that uses a plasma-enhanced chemical vapor deposition (CVD) method. According to the embodiment, for example, the step ST1 includes a film forming process of generating plasma of the processing gas G1 within the processing container 192 of the plasma processing apparatus 192 in which the wafer W is accommodated, and forming a film LA with respect to the surface of the wafer W (the inner surface (side surface and bottom surface) of a surface MK1 and a hole (including holes HL1 and HL2) of a mask MK) by the plasma CD method. The film LA formed by the step ST1 contains a silicon oxide and may contain, for example, $SiO_2$ according to the embodiment.

Figure 4:
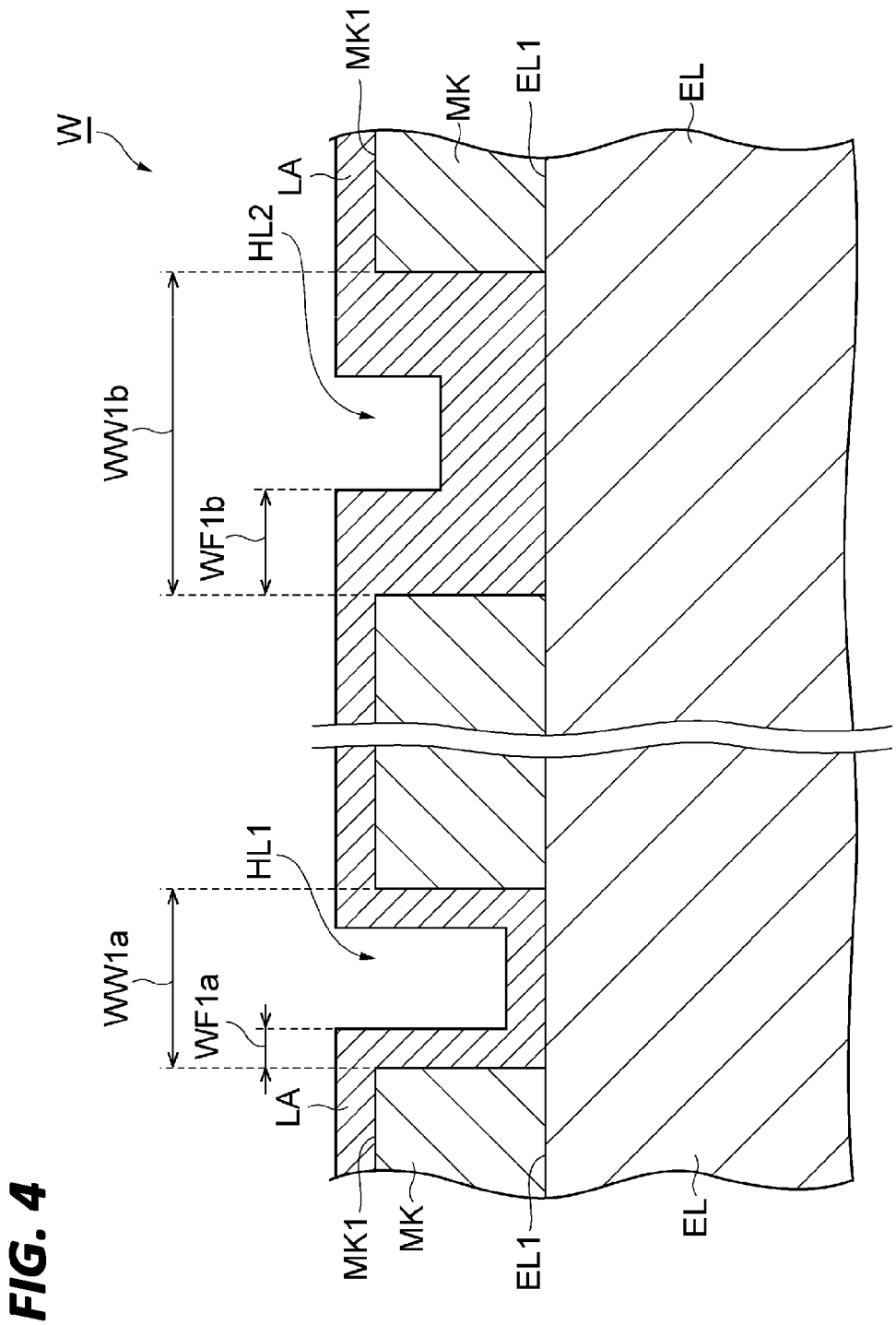
FIG. 4 is a cross-sectional view illustrating the state of a workpiece after a film is formed in the step illustrated in FIG. 1.

In the step ST1, the processing gas G1 is supplied to the processing container 192 to generate plasma of the processing gas G1 at a state where the wafer W is placed on the electrostatic chuck ESC. The processing gas G1 contains a gas species having a superior deposition property and contains, for example, silicon according to the embodiment. According to the embodiment, the processing gas G1 may be a mixed gas of $SiCl_4$ and He (according to the embodiment, the gas flow rates are 25 sccm ($SiCl_4$) and 100 sccm (He), respectively), a mixed gas of $SiCl_4$, $CH_4$, $H_2$, Ar (according to the embodiment, the gas flow rates are 20 sccm ($SiCl_4$), 100 sccm ($CH_4$), 100 sccm ($H_2$), and 800 sccm (Ar), respectively), or the like. The processing gas G1 is supplied from the selected gas source of a plurality of gas sources of the gas supply source 122 into the processing container 192. A high frequency power (e.g., 60 MHz and 300 to 1000 W according to the embodiment) is supplied from the high-frequency power source 150A and the high-frequency power source 150B, and the exhaust device 50 is operated to set the pressure of the processing space Sp in the processing container 192 to a preset value (e.g., 50 mTorr according to the embodiment). The execution time of the step ST1 is, for example, 60 s according to the embodiment. Since the processing gas G1 contains a gas species having a superior deposition property, the film thickness of the film LA formed in the step ST1 is relatively thin with respect to the inner surface having a relatively small hole HL1 and is relatively thick with respect to the inner surface having a relatively wide hole width, as illustrated in FIG. 4. FIG. 4 is a cross-sectional view illustrating the state of the wafer W after the film is formed in the step illustrated in FIG. 1. The value of a film thickness WF1a of the film LA formed on the inner surface of the hole HL1 is smaller than a film thickness WF1b of the film LA formed on the inner surface of the hole HL2.

In the step ST2 following the step ST1, the film thickness of the film LA is adjusted. More specifically, the film LA is isotropically etched in the step ST2. In the step ST2, the film LA is isotropically etched to adjust the film thickness of the film LA. In the step ST2, the processing gas G2 is supplied to the processing container 192 to generate plasma of the processing gas G2 at a state where the wafer W is placed on the electrostatic chuck ESC. The processing gas G2 includes fluorine and may be, for example, $Cl_2$ gas (according to the embodiment, the flow rate of the gas is 200 sccm), a mixed gas of $C_4F_8$ and Ar (according to the embodiment, the gas flow rates are 40 sccm ($C_4F_8$) and 200 sccm (Ar), respectively), or the like according to the embodiment. The processing gas G2 is supplied from the selected gas source of a plurality of gas sources of the gas supply source 122 into the processing container 192. A high frequency power (e.g., 60 MHz and 500 W according to the embodiment) is supplied from the high-frequency power source 150A and the high-frequency power source 150B, and the exhaust device 50 is operated to set the pressure of the processing space Sp in the processing container 192 to a preset value (e.g., 400 mTorr according to the embodiment). The execution time of the step ST2 is, for example, 30 s according to the embodiment.

When the film thickness of the film LA formed in the step ST1 is relatively thick with respect to the hole HL1 having a relatively small hole width, the opening of the hole HL1 may be occluded by the film LA. In order to avoid such a case, the film LA formed in the step ST1 is formed to be sufficiently thin so that the opening of the hole HL1 is not occluded, and the sequence SQ1 including the steps ST1 and ST2 (first sequence) is repeated until the film thickness of the film LA reaches a desired value. In this manner, by repeating the sequence SQ1 while sufficiently reducing the film thickness of the film LA formed in the step ST1, the film LA having the desired film thickness may be formed on the inner surface of the hole without occluding the opening of the hole.

Figure 5:
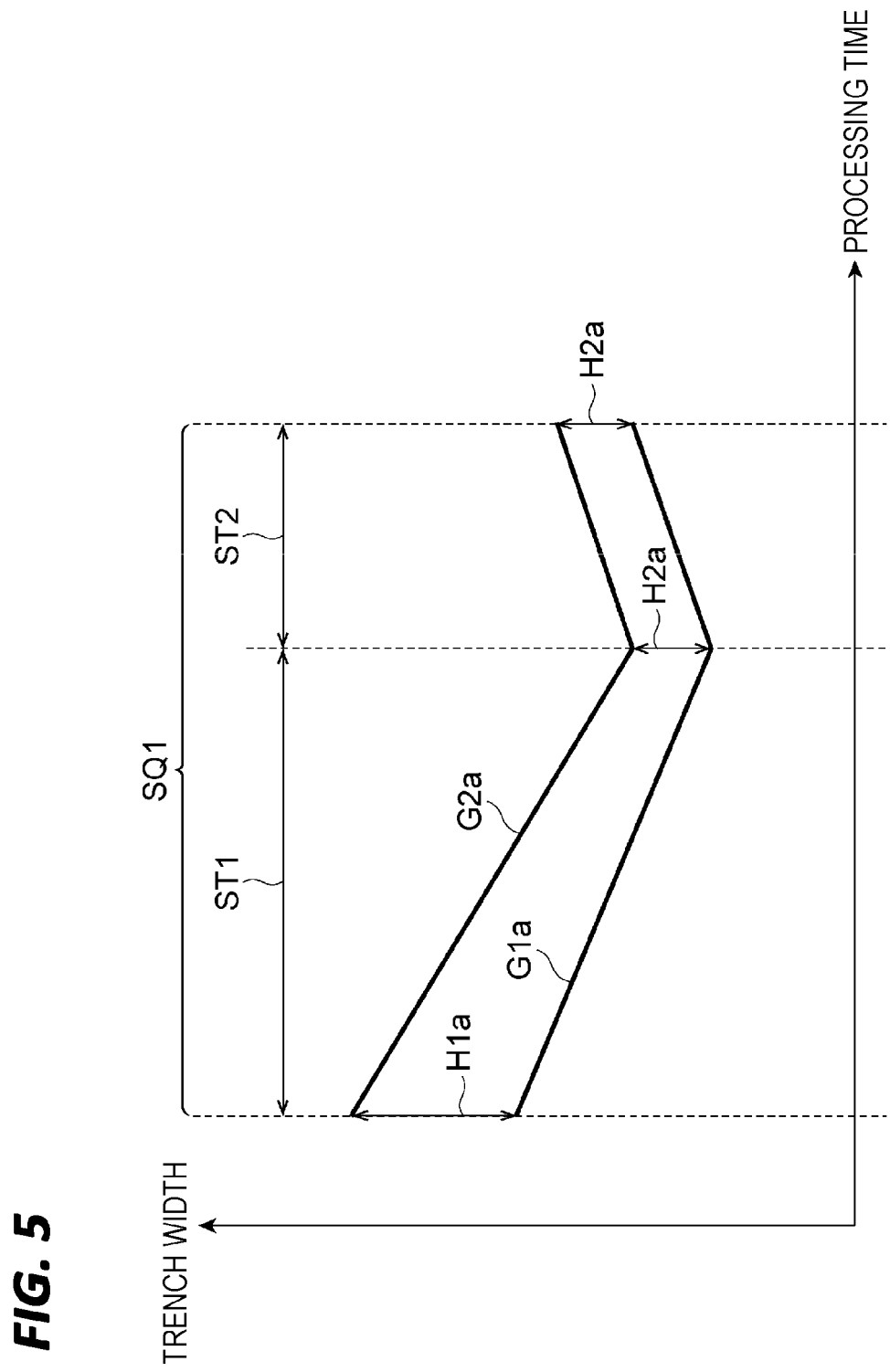
FIG. 5 is a view schematically illustrating the change in a hole width when the sequence illustrated in FIG. 1 is repeatedly executed.

The change in the hole width in the sequence SQ1 will be described with reference to FIG. 5. FIG. 5 is a view schematically illustrating the change in a hole width that occur when the sequence illustrated in FIG. 1 is repeatedly executed. A line G1a represents the change in the hole width of the hole HL1, and a line G2a represents the change in the hole width of the hole HL2. When the film LA is formed in the step ST1, the film LA is relatively thin in the hole HL1 having a relatively narrow hole width, and the film LA is relatively thick in the hole HL2 having a relatively wide hole width. Thus, the difference between the hole width in the hole HL2 and the hole width in the hole HL1 (difference H2a) at the end of the step ST1 is smaller than the difference at the start of the step ST1 (difference H1a). Since isotropic etching is performed in the step ST2 following the step ST1, the film LA is etched while the difference in the hole width between the hole HL2 and the hole HL1 (difference H2a) is maintained constantly. Therefore, the difference in the hole width between the hole HL2 and the hole HL1 at the end of the step ST2 (difference H2a) is maintained as in the case of the start of the step ST2. In this manner, every time the sequence SQ1 is executed, the difference in the hole width between the hole HL2 and the hole HL1 is reduced stepwise, and by executing the sequence SQ1 a plurality of times, the difference converges within a desired range so that the variation of the holes of the wafer W may be sufficiently reduced.

Figure 6:
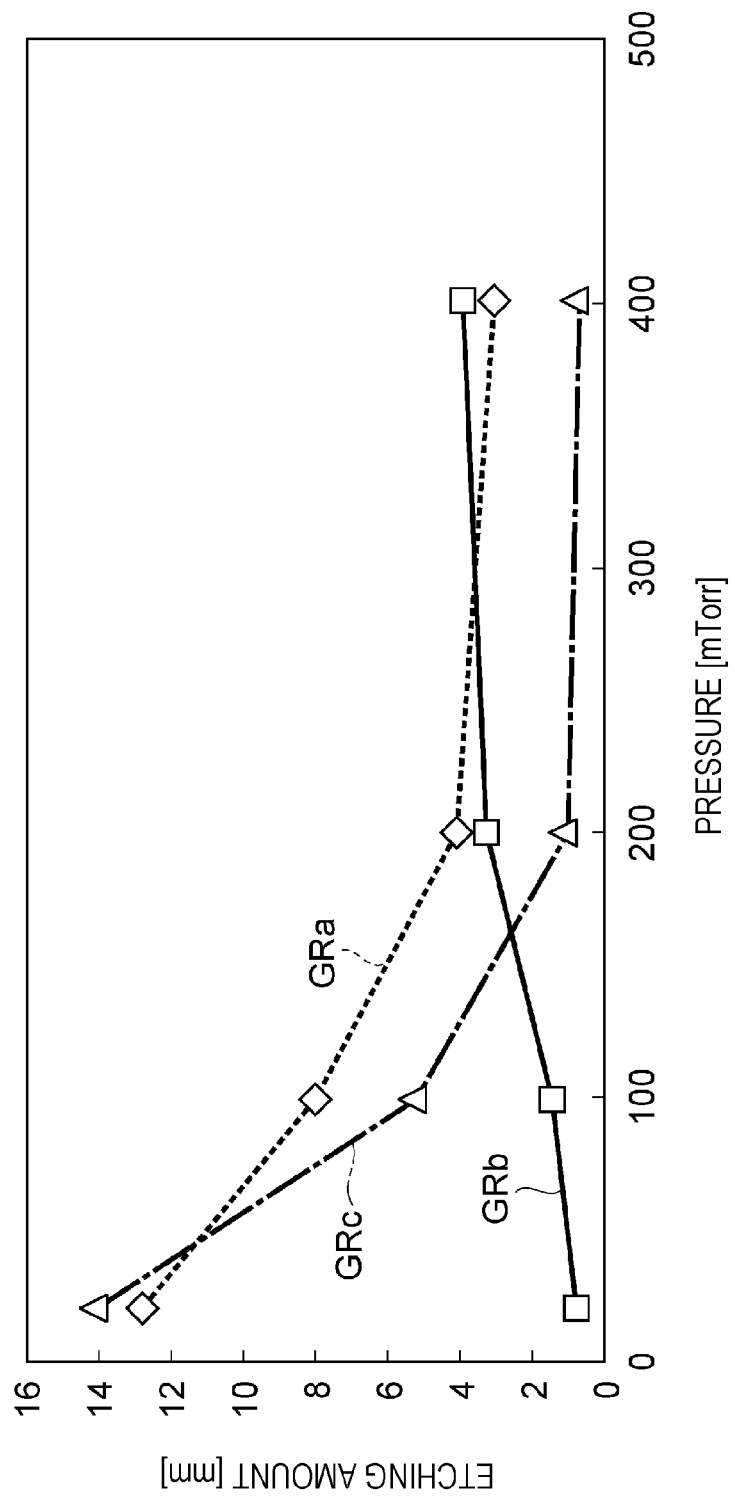
FIG. 6 is a view illustrating a relationship between the isotropy of etching and a pressure in the step illustrated in FIG. 1.

Subsequently, the conditions for causing the etching of the step ST2 to have isotropy will be described. FIG. 6 is a view illustrating a relationship between the isotropy of etching and a pressure in the step ST2 illustrated in FIG. 1. The vertical axis in FIG. 6 represents an etching amount (nm), and the horizontal axis in FIG. 6 represents the pressure (mTorr) in the processing space Sp. A line GRa in FIG. 6 represents the change in the etching amount of the bottom side of the hole (vertical side), a line GRb in FIG. 6 represents the change in the etching amount of the lateral side of the hole (horizontal side), and a line GRc in FIG. 6 represents the change in the value obtained by dividing the etching amount of the bottom side of the hole (vertical side) by the etching amount of the lateral side of the hole (horizontal side) (horizontal ratio). As illustrated in FIG. 6, when the pressure of the processing space Sp is relatively high (200 mTorr) or more (e.g., approximately 400 mTorr according to the embodiment), sufficiently isotropic etching may be implemented in the step ST2.

<Modification of Step ST2>

Figure 7:
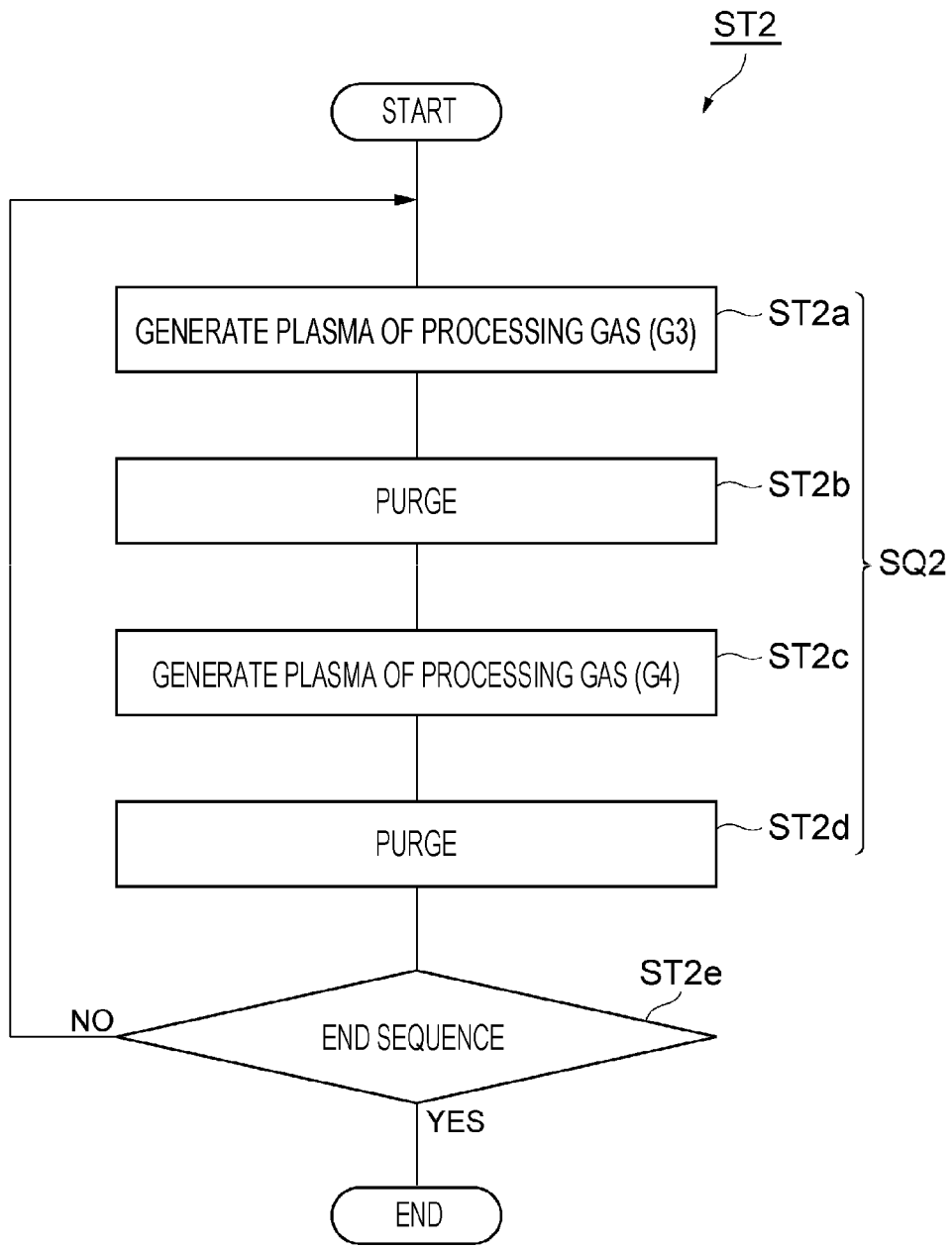
FIG. 7 is a flow chart illustrating another example of an etching step included in the method illustrated in FIG. 1.

The isotropic etching of the step ST2 may be implemented by the method illustrated in, for example, FIG. 7 according to the embodiment. The method illustrated in FIG. 7 is a method of etching the film LA isotropically and uniformly by the same method as the atomic layer etching (ALE) method, regardless of the hole width and the hole density. In the meantime, the isotropic etching of the step ST2 is not limited to the method illustrated in FIG. 7. FIG. 7 is a flow chart illustrating another example of the step ST2 included in the method illustrated in FIG. 1. The step ST2 illustrated in FIG. 7 includes a sequence SQ2 (second sequence) and a step ST2e. The sequence SQ2 includes the step ST2e (third step), a step ST2b (fourth step), a step ST2c (fifth step), and a step ST2d (sixth step).

In the step ST2a, plasma of the processing gas G3 (first gas) is generated in the processing container 192 of the plasma processing apparatus 10 in which the wafer W is accommodated, and a mixed layer MX that includes the ions included in the plasma of the processing gas G3 is isotropically and uniformly formed with respect to the atomic layer on the inner surface of the hole. In the step ST2a, the mixed layer MX that includes the ions included in the plasma of the processing gas G3 may be isotropically and uniformly formed with respect to the atomic layer on the surface of the film LA. In the step ST2a, the processing gas G3 is supplied to the processing container 192 to generate plasma of the processing gas G3 at a state where the wafer W is placed on the electrostatic chuck ESC. The processing gas G3 includes nitrogen, and according to the embodiment, may include, for example, $N_2$ gas (the gas flow rate is, e.g., 100 sccm according to the embodiment). Specifically, the processing gas G3 is supplied from the selected gas source of a plurality of gas sources of the gas source 122 into the processing container 192. In addition, a high frequency power (e.g., 60 MHz and 600 W according to the embodiment) is supplied from the high-frequency power source 150A and the high-frequency power source 150B, and the exhaust device 50 is operated to set the pressure of the processing space Sp in the processing container 192 to a preset value (e.g., 400 mTorr according to the embodiment). In this manner, the plasma of the processing gas G3 is generated in the processing container 192. The execution time of the step ST2a is, for example, 400 to 600 s according to the embodiment.

Figure 8:
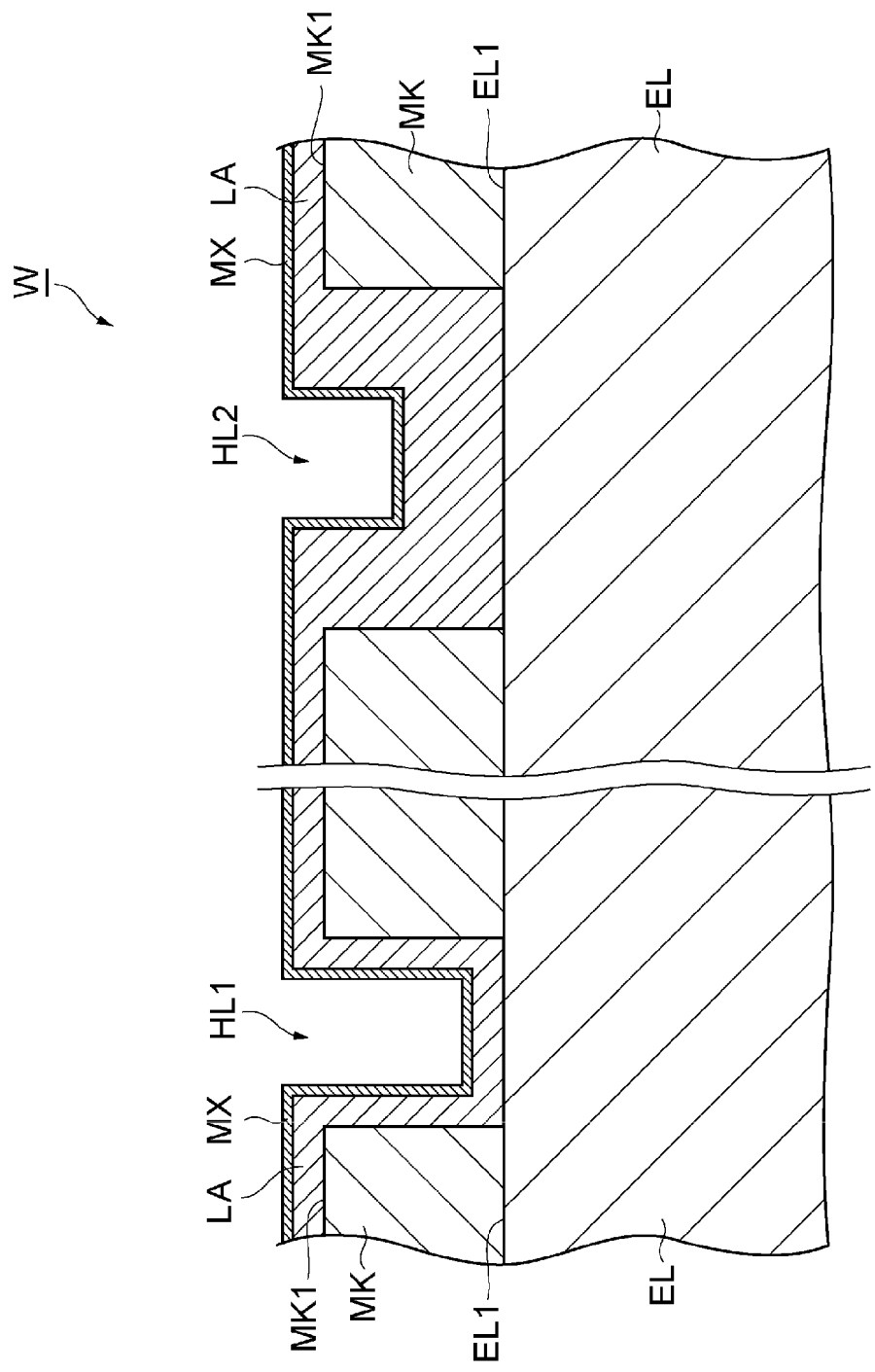
FIG. 8 is a cross-sectional view illustrating the state of the workpiece after surface modification in the method illustrated in FIG. 7.

The set value of the pressure of the processing space Sp in the step ST2 (especially, the step ST2a) is relatively high (200 mTorr or more) as illustrated in FIG. 6, and may be, for example, 400 mTorr according to the embodiment. When the pressure of the processing space Sp is relatively high in this way, the ions of the nitrogen atom included in the plasma of the processing gas G3 (hereinafter, referred to as a nitrogen ion) are isotropically brought into contact with the surface of the film LA so that the surface of the film LA is isotropically and uniformly modified by the nitrogen ions. Thus, the mixed layer MX having a uniform (substantially uniform) thickness is also formed on the surface of the film LA as illustrated in FIG. 8. FIG. 8 is a cross-sectional view illustrating the state of the wafer W after surface modification in the method illustrated in FIG. 7.

In the step ST2a, the plasma of the processing gas G3 is generated within the processing container 192 in this manner, and the nitrogen ions included in the plasma of the processing gas G3 are brought into contact with the surface of the film LA by drawing the ions by the high frequency bias power in the vertical direction (the direction toward the surface of the wafer W placed on the electrostatic chuck ESC from the ceiling side of the processing container 192 (specifically, e.g., the plate-like dielectric 194), so that the surface of the film LA is isotropically and uniformly modified. In this manner, the surface of the film LA in the step ST2a becomes a mixed layer MX having a uniform thickness (substantially the same thickness) over the surface of the wafer W. Since the processing gas G3 includes nitrogen and the film LA includes silicon oxide (e.g., $SiO_2$ according to the embodiment), the composition of the mixed layer MX may be, for example, $SiN/SiO_2$ (SiON) according to the embodiment.

Figure 9:
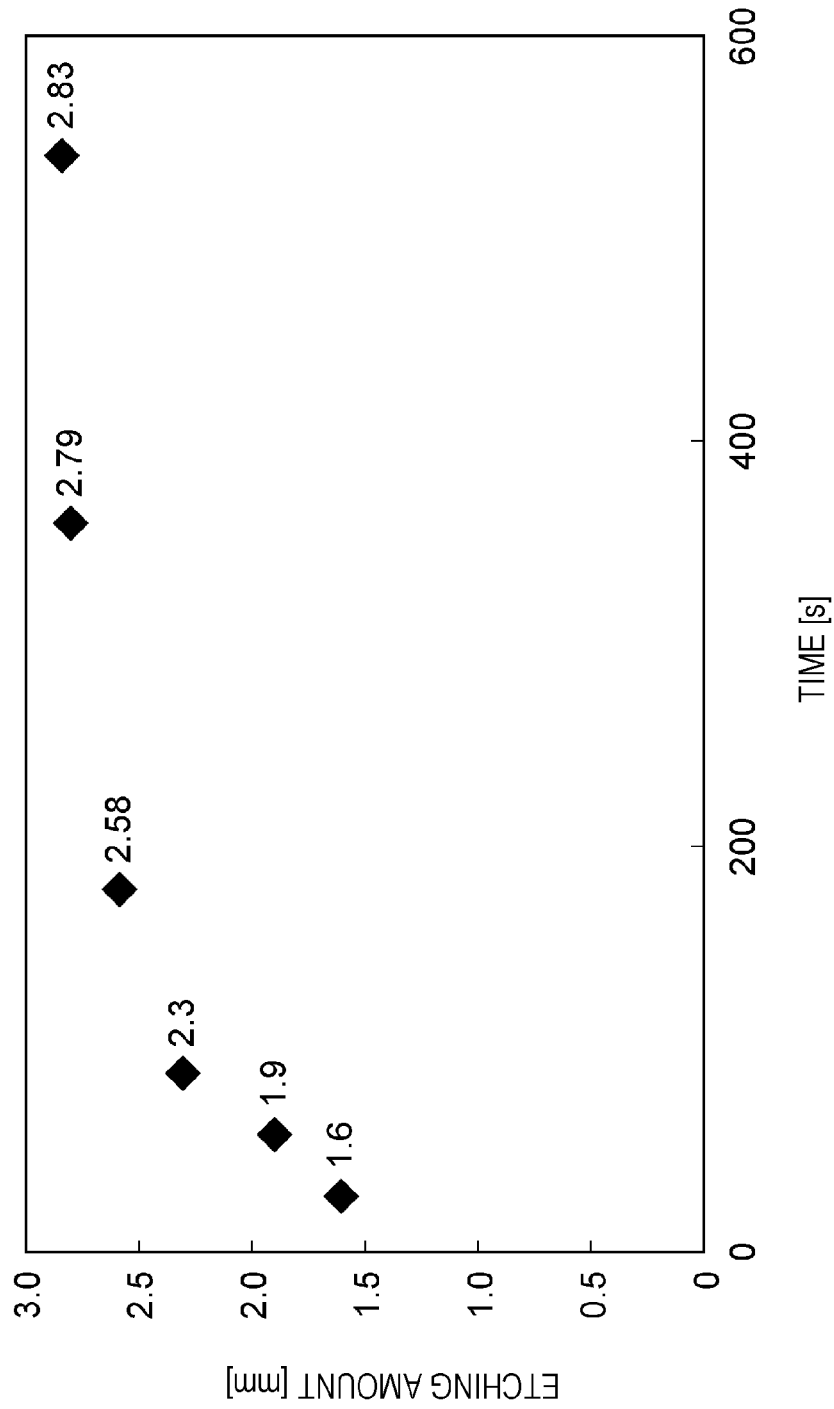
FIG. 9 illustrates the self-controllability of surface modification in the sequence illustrated in FIG. 7.

The processing time in the step ST2a is longer than the time required to reach the self-control area of the ALE method. FIG. 9 illustrates the self-controllability of surface modification in the sequence SQ2 (in particular, the step ST2a) illustrated in FIG. 7. The horizontal axis in FIG. 9 represents the processing time (s) of the surface modification (more specifically, the processing performed in the step ST2a), and the vertical axis in FIG. 9 represents the etching amount (nm) (the thickness of which the portion is surface modified by the step ST2a). The result illustrated in FIG. 9 is a result obtained by executing the step ST2a in which the pressure of the processing space Sp is set to 400 mTorr, the value of the high frequency power is set to 600 W, and the value of the high-frequency bias power is set to 50 W. As illustrated in FIG. 9, the surface modification performed by the step ST2a involves self-controllability. That is, when the surface modification is performed over the time taken to reach the self-control area of the ALE method, the surface modification is isotropically and uniformly performed regardless of the hole width and the hole density, and thus, an isotropic and uniform mixed layer MX may be formed in the same manner on the surface of the wafer W (the inner surface of the surface MK1 of the mask MK, and the inner surface of the trench of the mask MK (including the holes HL1 and HL2)).

Figure 10C:
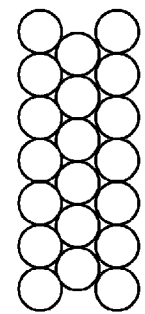
FIGS. 10A to 10C are views illustrating the principle of etching in the step illustrated in FIG. 7.
Figure 10B:
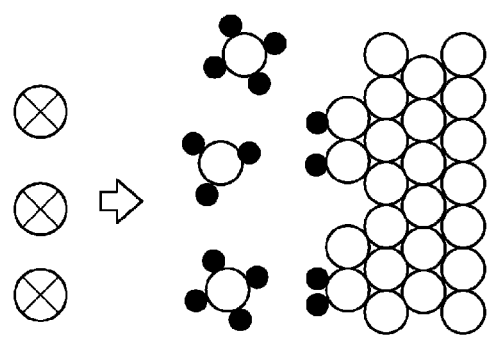
Figure 10A:
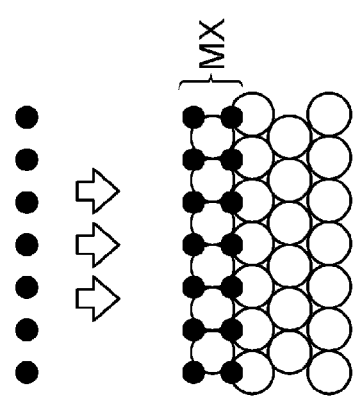

FIGS. 10A to 10C are views illustrating the principle of etching in the step illustrated in FIG. 8. In FIGS. 10A to 10C, a blank circle (white circle) represents an atom constituting the film LA (atoms constituting $SiO_2$ according to the embodiment), a black circle represents the nitrogen ion included in the plasma of the processing gas G3, and a circled "x" represents the radicals included in the plasma of the processing gas G4, which will be described later. As illustrated in FIG. 10A, the nitrogen ions included in the plasma of the processing gas G3 (black circles) are isotropically supplied to the atomic layer on the surface of the film LA by the step ST2a. In this manner, a mixed layer MX that includes atoms constituting the film LA and nitrogen atoms of the processing gas G3 is formed in the atomic layer on the surface of the film LA by the step ST2a.

As described above, since the processing gas G3 includes nitrogen, nitrogen atoms are supplied to the atomic layer on the surface of the film LA (the atomic layer of the silicon oxide) in the step ST2a, so that the mixed layer MX containing the silicon nitride (e.g., $SiN/SiO_2$ according to the embodiment) may be formed in the atomic layer on the surface of the film LA.

The processing space Sp in the processing container 192 is purged in the step ST2b following the step ST2a. Specifically, the processing gas G3 supplied in the step ST2b is exhausted. In the step ST2b, an inert gas such as a rare gas (e.g., Ar gas according to the embodiment) may be supplied as a purge gas to the processing container 192. That is, the purging of the step ST2b may be either gas purging for causing an inert gas to flow into the processing container 192 or purging by vacuuming.

In the step ST2c following the step ST2b, the plasma of the processing gas G4 (second gas) is generated in the processing container 192, and the entire mixed layer MX is removed by chemical etching using the radicals included in the plasma. Thus, the film LA may be etched isotropically and uniformly over the surface of the wafer W (particularly, the film LA provided on the inner surfaces of all the holes). In the step ST2c, the processing gas G4 is supplied into the processing container 192 to generate the plasma of the processing gas G4 at a state where the wafer W after the formation of the mixed layer MX in the step ST2a is placed on the electrostatic chuck ESC. The plasma of the processing gas G4 generated in the step ST2c includes radicals that remove the mixed layer MX including the silicon nitride. The processing gas G4 includes fluorine and may be a mixed gas that includes, for example, $NF_3$ gas and $O_2$ gas according to the embodiment. The processing gas G4 may be a mixed gas including $NF_3$ gas, $O_2$ gas, $H_2$ gas, and Ar gas, a mixed gas including $CH_3F$ gas, $O_2$ gas, and Ar gas, or the like. Specifically, the processing gas G4 is supplied from the selected gas sources of a plurality of gas sources of the gas source 122 to the processing container 192, the high frequency power is supplied from the high-frequency power source 150A and the high-frequency power source 150B (e.g., 60 MHz and 600 W according to the embodiment), and the pressure of the processing space Sp in the processing container 192 is set to a preset value (e.g., 400 mTorr according to the embodiment) by operating the exhaust device 50. In this manner, the plasma of the processing gas G4 is generated in the processing container 192. The execution time of the step ST2c is, for example, 400 to 600 s according to the embodiment.

As illustrated in FIG. 10B, the radicals in the plasma of the processing gas G4 generated in the step ST2c ("x" surrounded by a circle in FIG. 10B) are brought into contact with the mixed layer MX on the surface of the film LA, and the radicals of atoms of the processing gas G4 are supplied to the mixed layer MX formed on the surface of the film LA so that the mixed layer MX may be removed from the film LA by chemical etching. As illustrated in FIG. 10C, the entire mixed layer MX formed on the surface of the film LA in the step ST2c may be removed from the surface of the film LA by the radical included in the plasma of the processing gas G4. By removing the mixed layer MX, the hole width is isotropically and uniformly increased over the surface of the wafer W, regardless of the hole width and the hole density.

The processing space Sp in the processing container 192 is purged in the step ST2d following the step ST2c. Specifically, the processing gas G4 supplied in the step ST2d is exhausted. In the step ST2d, an inert gas such as a rare gas (e.g., Ar gas according to the embodiment) may be supplied as a purge gas to the processing container 192. That is, the purging of the step ST2d may be either gas purging for causing an inert gas to flow into the processing container 192 or purging by vacuuming.

It is determined whether the execution of the sequence SQ2 is terminated in the step ST2e following the sequence SQ2. Specifically, in the step ST2e, it is determined whether the number of executions of the sequence SQ2 reaches a predetermined number. Determination of the number of executions of the sequence SQ2 is to determine the etching amount for the film LA. The sequence SQ2 may be repeatedly performed so that the film LA is etched until the etching amount for the film LA reaches a preset value. As the number of executions of the sequence SQ2 increases, the etching amount for the film LA also increases (increases substantially linearly). Therefore, the number of executions of the sequence SQ2 may be determined so that the product of the thickness of the film LA (the thickness of the mixed layer MX formed in the step ST2e that is performed once), which is etched by the execution of the sequence SQ2 performed once (unit cycle), and the number of executions of the sequence SQ2 becomes a preset value.

Figure 11:
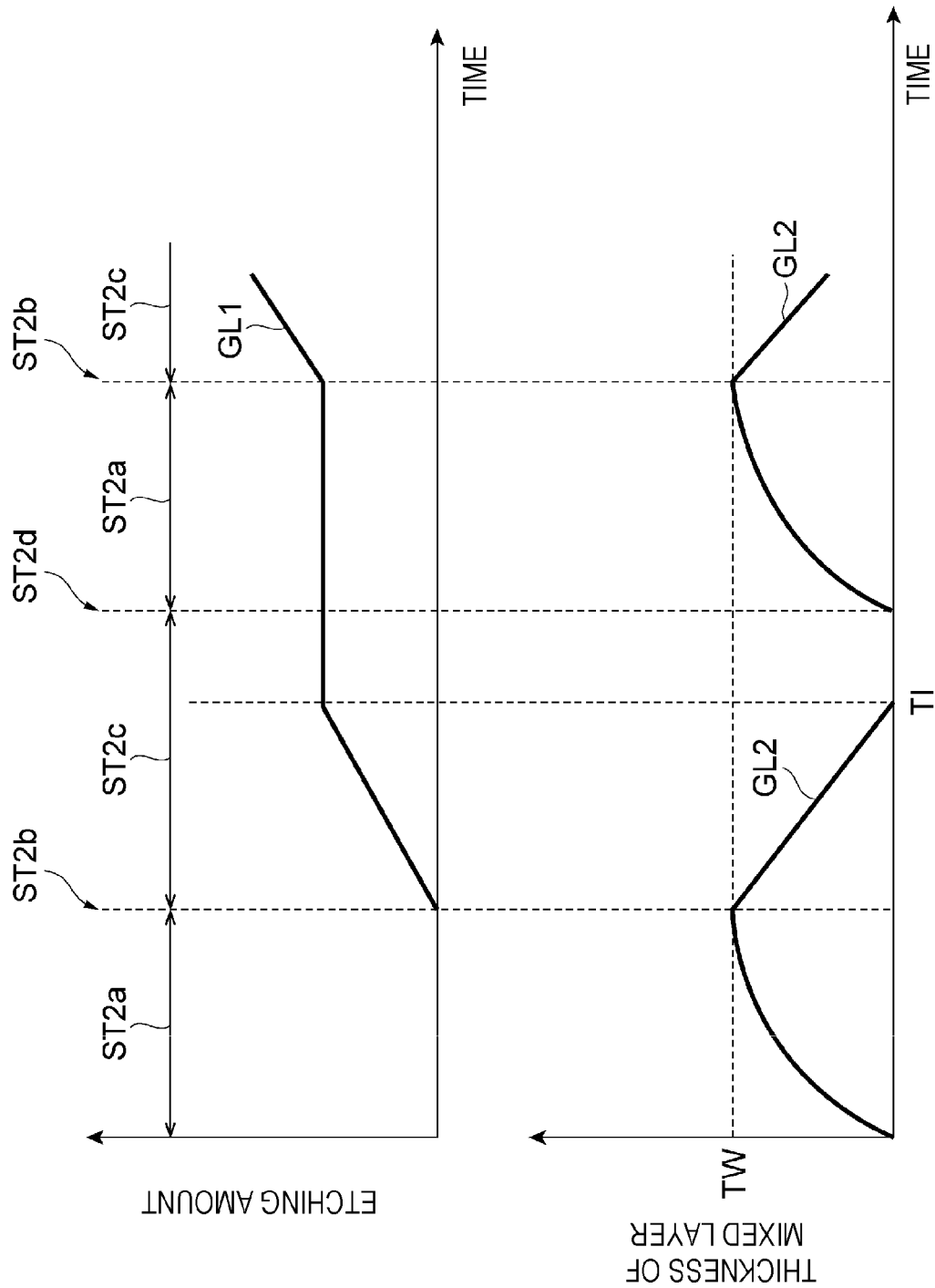
FIG. 11 is a view illustrating the changes in the amount of etching and the thickness of a mixed layer formed on the film during the execution of the sequence illustrated in FIG. 7.

With reference to FIG. 11, descriptions will be made on the change in the etching amount with respect to the film LA generated during the execution of the sequence SQ2 and the change in the thickness of the mixed layer MX formed in the film LA. A line GL1 in FIG. 11 represents the change in the etching amount (arbitrary unit) with respect to the film LA occurring during the execution of the sequence SQ2, and a line GL2 in FIG. 11 represents the change in the thickness of the mixed layer MX (arbitrary unit) occurring during the execution of the sequence SQ2. The horizontal axis in FIG. 11 represents the time during which the sequence SQ2 is executed, but the execution time in the step ST2b and the execution time in the step ST2d are omitted for the sake of simplicity. As illustrated in FIG. 11, in the execution of the sequence SQ2 performed once (unit cycle), the execution of the step ST2a is performed until the thickness of the mixed layer MX reaches a preset value TW, as indicated by the line GL2. The value TW of the thickness of the mixed layer MX formed in the step ST2a may be determined by the value of the bias power applied by the high-frequency power source 64, the dose per unit time for the film LA of the nitrogen ion included in the plasma of the processing gas G3, and the execution time of the step ST2c.

As illustrated in FIG. 11, in the execution of the sequence SQ2 performed once (unit cycle), the execution of the step ST2c is performed until the entire mixed layer MX formed in the step ST2a is removed as indicated by the lines GL1 and GL2. The entire mixed layer MX is removed by chemical etching until a timing TI is reached during the execution of the step ST2c. The timing TI may be determined by the etching rate of the chemical etching performed in the step ST2c. The timing TI occurs during the execution of the step ST2c. During the period from the timing TI to the end of the step ST2c, the film LA of the silicon oxide after removal of the mixed layer MX is not etched by the plasma of the processing gas G4. That is, when the radicals included in the plasma of the processing gas G4 are used, the etching rate of the etching for the silicon oxide (e.g., $SiO_2$) constituting the film LA is extremely small compared to the etching rate of the etching for the silicon nitride (e.g., SiN) included in the mixed layer MX.

When it is determined in the step ST2e that the number of executions of the sequence SQ2 has not reached the preset number ("NO" in the step ST2e), the execution of the sequence SQ2 is repeated again. In the meantime, when it is determined in the step ST2e that the number of executions of the sequence SQ2 has reached the preset number ("YES" in the step ST2e), the step ST2 ends and proceeds to the step ST3 illustrated in FIG. 1.

As described above, a series of isotropic etching processes of the sequence SQ2 and the process ST2e may remove the surface of the film LA for each atomic layer by the same method as the ALE method. Therefore, a series of isotropic etching processes of the sequence SQ2 and the step ST2e may be performed by repeatedly executing the sequence SQ2 so as to remove the surface of the film LA for each atomic layer, thereby etching the film LA isotropically and precisely regardless of the hole width and the hole density. That is, since the sequence SQ2 is repeated a predetermined number of times, the film LA is isotropically and precisely etched at an isotropic and uniform thickness (approximately the same thickness) over the entire surface of the wafer W, regardless of the hole width and the hole density.

<Modification of Step ST1>

Figure 12:
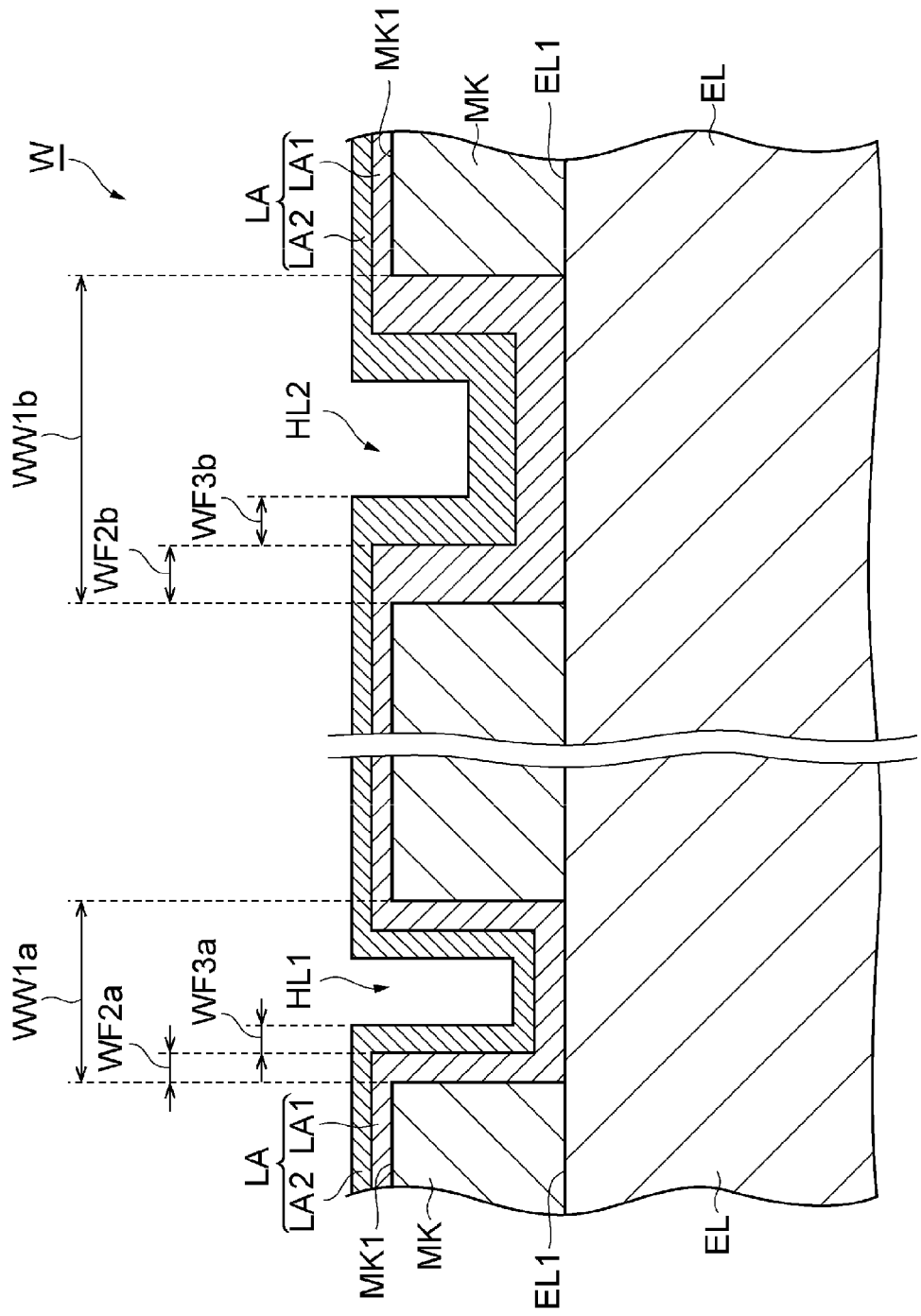
FIG. 12 is a cross-sectional view illustrating the state of the workpiece after a two-layered film is formed in the film forming step illustrated in FIG. 1.

Subsequently, another embodiment of the step ST1 (modification) will be described. The film LA illustrated in FIG. 4 is one layer, but may be a two layer without being limited thereto. FIG. 12 is a cross-sectional view illustrating the state of the wafer W after a two-layered film is formed in the film forming step illustrated in FIG. 1. The film LA illustrated in FIG. 12 includes a two-layered film, and also includes a film LA1 (first film) and a film LA2 (second film). The film LA1 is formed on the surface of the wafer W (the surface MK1 of the mask MK (including the inner surface of the hole)), and the film LA2 is formed on the surface of the film LA1. The film LA1 in the hole HL1 has a film thickness WF2a, and the film LA2 in the hole HL1 has a film thickness WF3a. The film LA1 in the hole HL2 has a film thickness WF2b, and the film LA2 in the hole HL2 has a film thickness WF3b. Since the hole width WW1a of the hole HL1 is narrower than the hole width WW1b of the hole HL2, the film thickness WF2a is thinner than the film thickness WF2b and the film thickness WF3a is thinner than the film thickness WF3b. The film LA1 and the film LA2 include a silicon oxide and may include, for example, $SiO_2$ according to the embodiment. The oxygen content of the film LA2 is higher than the oxygen content of the film LA1. The etching resistance of the film LA1 performed in the step ST2 is lower in the film LA1 than the film LA2. That is, the value of the etching rate (nm/min) of the film LA1 for the etching performed in the step ST2 is greater than the value of the etching rate (nm/min) of the film LA2 for the etching performed in the step ST2.

The step ST1 according to the modification will be described with reference to FIG. 13. The step ST1 illustrated in FIG. 13 includes the step ST1a (seventh step) and the step ST1b (eighth step). In the step ST1a, the film LA1 is formed on the inner surface of the hole. In the step ST1b, the film LA2 is formed on the film LA1. According to the embodiment, for example, in the step ST1a, the film LA1 having a relatively low etching resistance with respect to the etching performed in the step ST2 is formed by a plasma CVD method, and in the step ST1b, the film LA2 having a relatively high etching resistance with respect to the etching performed in the step ST2 is formed by the plasma CVD method. That is, according to the embodiment, the film LA1 is formed using the plasma CVD method in the step ST1a, and the film LA2 is formed using the plasma CVD method in the step ST1b.

Figure 14:
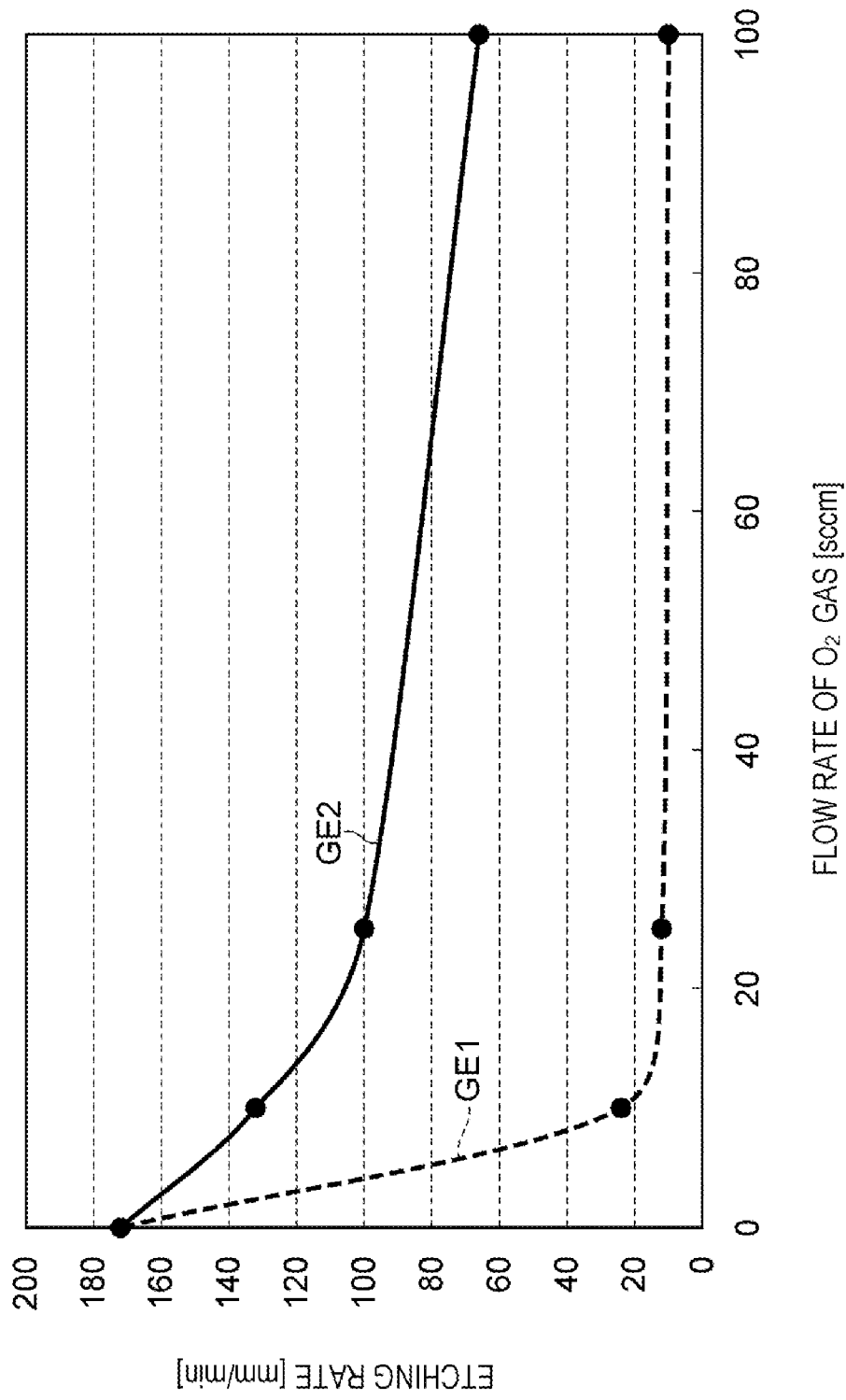
FIG. 14 is a view illustrating a correlation between the amount of oxygen added during film formation and the etching resistance of the film.

The etching resistance of the silicon oxide film may be changed by the flow rate of the $O_2$ gas added at the time of film formation. FIG. 14 is a view illustrating a correlation between the amount of oxygen added during film formation and the etching resistance of the film. The horizontal axis in FIG. 14 represents the flow rate (sccm) of $O_2$ gas that may be added during the film formation, and the vertical axis in FIG. 14 represents the etching rate (nm/min) indicating the etching resistance of the film. The result indicated by a line GE1 in FIG. 14 is obtained by using, as film forming conditions, a pressure of 10 mTorr, a high frequency power of 60 MHz and 1000 W by the high-frequency power source 150A and the high-frequency power source 150B, a mixed gas of $SiCl_4$ (25 sccm), He (100 sccm), and $O_2$ (0 to 100 sccm), and a processing time of 60 s, and by using, as etching conditions, a pressure of 20 mTorr, a high frequency power of 60 MHz and 500 W by the high-frequency power source 150A and the high-frequency power source 150B, a high frequency power of 40 MHz and 50 W by the high-frequency power source 64, $Cl_2$ gas (200 sccm), and a processing time of 60 s. The result indicated by a line GE2 in FIG. 14 is obtained by using, as etching conditions, a pressure of 20 mTorr, a high frequency power of 60 MHz and 500 W by the high-frequency power source 150A and the high-frequency power source 150B, a high frequency power of 40 MHz and 100 W by the high-frequency power source 64, a mixed gas of $C_4F_8$ (40 sccm) and Ar (200 sccm), and a processing time of 60 s. As illustrated in FIG. 14, it is possible to change the etching resistance of the silicon oxide film by adjusting the amount of oxygen added (the flow rate of $O_2$ gas). As the amount of oxygen added decreases, the etching rate increases. For example, in FIG. 14, the selection ratio of the etching may be controlled within the range of 1 to 17 by adjusting the amount of oxygen added.

Figure 13:
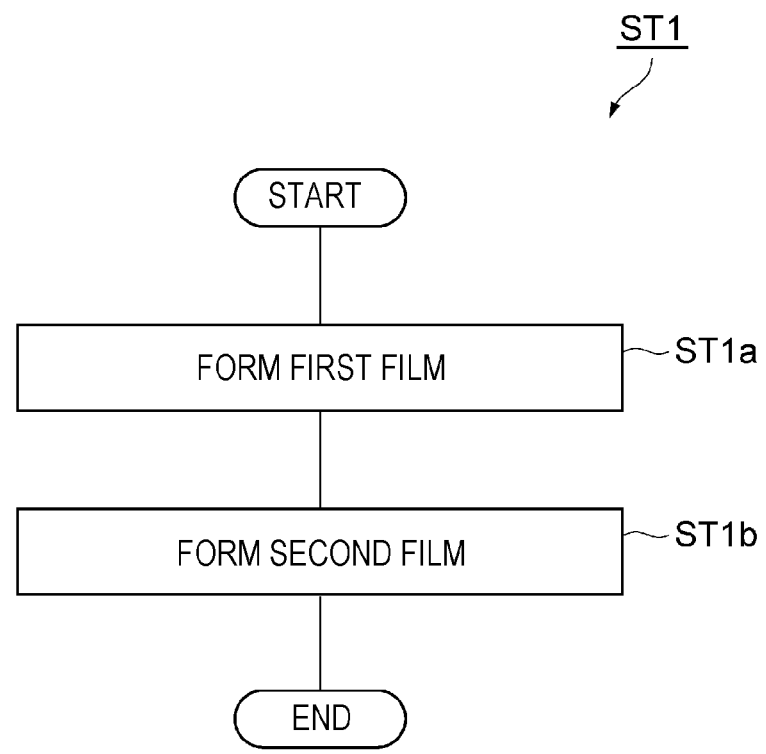
FIG. 13 is a flow chart illustrating an example of forming the two-layered film in the film forming step illustrated in FIG. 1.

FIG. 13 is referred back to again. In the step ST1a, a processing gas G5 is supplied to the processing container 192 to generate plasma of the processing gas G5 at a state where the wafer W is placed on the electrostatic chuck ESC. The processing gas G5 contains a gas species having a superior deposition property and contains, for example, silicon according to the embodiment. The processing gas G5 is a mixed gas of $SiCl_4$, He, and $O_2$ (according to embodiment, the gas flow rates are 25 sccm ($SiCl_4$), 100 sccm (He), and 0 to 5 sccm ($O_2$), respectively), or the like. The $O_2$ gas included in the processing gas G5 is about 0 to several sccm (according to embodiment, about 0 to 5 sccm), which is relatively small. The processing gas G5 is supplied from the selected gas source of a plurality of gas sources of the gas supply source 122 into the processing container 192. A high frequency power (e.g., 60 MHz and 1000 W according to the embodiment) is supplied from the high-frequency power source 150A and the high-frequency power source 150B, and the exhaust device 50 is operated to set the pressure of the processing space Sp in the processing container 192 to a preset value (e.g., 10 mTorr according to the embodiment). The execution time of the step ST1a is, for example, 60 s according to the embodiment. Since the processing gas G5 contains a gas species having a superior deposition property, as illustrated in FIG. 12, the film thickness of the film LA1 formed by the step ST1a is relatively thin with respect to the inner surface of the hole HL1 having a relatively narrow hole width and is relatively thick with respect to the inner surface of the hole HL2 having a relatively wide hole width. That is, the value of the film thickness WF2a of the film LA1 formed on the inner surface of the hole HL1 is smaller than the film thickness WF2b of the film LA1 formed on the inner surface of the hole HL2.

In the step ST1b following the step ST1a, a processing gas G6 is supplied into the processing container 192 to generate plasma of the processing gas G6 while the wafer W is placed on the electrostatic chuck ESC. The processing gas G6 contains a gas species having a superior deposition property and contains, for example, silicon according to the embodiment. According to the embodiment, the processing gas G6 may be a mixed gas of $SiCl_4$, He, and $O_2$ (according to the embodiment, the gas flow rates are 25 sccm ($SiCl_4$), 100 sccm (He), 100 sccm ($O_2$), respectively), or the like. The $O_2$ gas included in the processing gas G6 is about 100 sccm according to the embodiment, which is relatively large. The processing gas G6 is supplied from the selected gas source of a plurality of gas sources of the gas supply source 122 into the processing container 192. A high frequency power (e.g., 60 MHz and 1000 W according to the embodiment) is supplied from the high-frequency power source 150A and the high-frequency power source 150B, and the exhaust device 50 is operated to set the pressure of the processing space Sp in the processing container 192 to a preset value (e.g., 10 mTorr according to the embodiment). The execution time of the step ST1b is, for example, 60 s according to the embodiment. Since the processing gas G6 contains a gas species having a superior deposition property, as illustrated in FIG. 12, the film thickness of the film LA2 formed by the step ST1b is relatively thin with respect to the inner surface of the hole HL1 having a relatively narrow hole width and is relatively thick with respect to the inner surface of the hole HL2 having a relatively wide hole width. That is, the value of the film thickness WF3a of the film LA2 formed on the inner surface of the hole HL1 is smaller than the film thickness WF3a of the film LA2 formed on the inner surface of the hole HL2.

Figure 15:
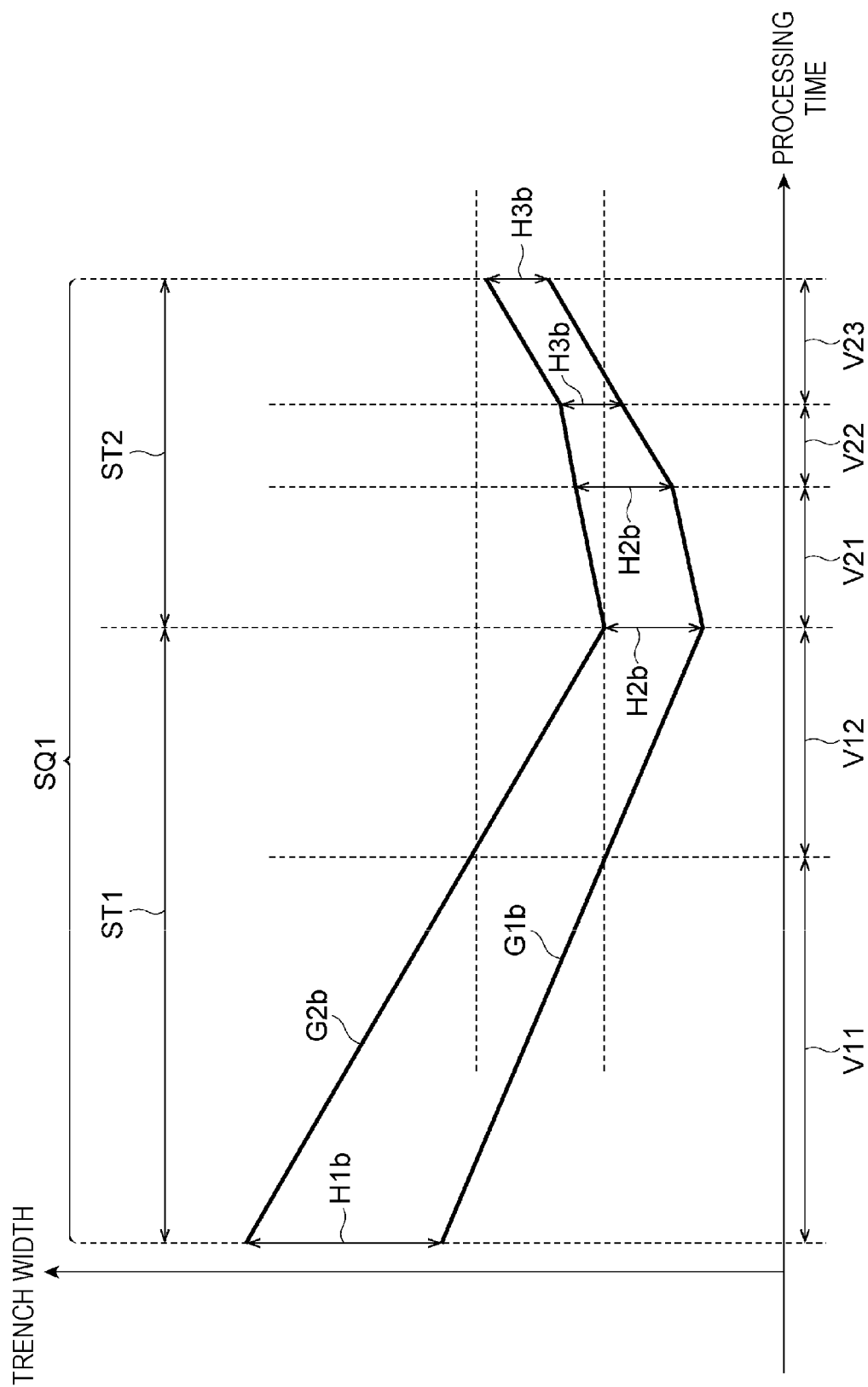
FIG. 15 is a view schematically illustrating the change in the hole width that may occur when the film forming step illustrated in FIG. 1 forms the two-layered film and the sequence illustrated in FIG. 1 is repeatedly executed.

With reference to FIG. 15, descriptions will be made on the change in the hole width that may occur when the method MT includes the step ST1 illustrated in FIG. 13 (the step of forming a two-layered film (the film LA1 and the film LA2)). FIG. 15 is a view schematically illustrating the change in the hole width that may occur when the film forming step illustrated in FIG. 1 forms the two-layered film and the sequence illustrated in FIG. 1 is repeatedly executed. The line G1a represents the change in the hole width of the hole HL1, and the line G2b represents the change in the hole width of the hole HL2.

The step ST1 includes a step represented by a section V11 and a step represented by a section V12. The section V11 represents the step ST1a in which the film LA1 is formed, and the section V12 represents the step ST1b in which the film LA2 is formed. The film LA1 having a relatively low etching resistance is formed in the section V11 and the film LA2 having a relatively high etching resistance is formed in the section V12 following the section V11. When the film LA is formed in the step ST1, the film LA is relatively thin in the hole HL1 having a relatively narrow hole width, and the film LA is relatively thick in the hole HL2 having a relatively wide hole width. Thus, the difference between the hole width at the hole HL2 and the hole width at the hole HL1 (difference H2b) at the end of the step ST1 is smaller than the difference at the start of the step ST1 (difference H1b).

Isotropic etching is performed in the step ST2 following the step ST1. The step ST2 includes a step represented by a section V21, a step represented by a section V22, and a step represented by a section V23. The section V21 represents the step from the start of the step ST2 until the entire film LA2 in the hole HL1 is removed by etching. In the section V21, the film LA2 having a relatively high etching resistance is etched in any of the holes HL1 and HL2. Since the film thickness WF3a of the film LA2 in the hole HL1 is thinner than the film thickness WF3b of the film LA2 in the hole HL2, the film LA2 in the hole HL1 is removed by etching earlier than the film LA2 in the hole HL2. At the end of the section V21, the entire film LA2 in the hole HL1 is removed by etching, but a portion of the film LA2 in the hole HL2 remains. In the section V21, isotropic etching is performed on the film LA2 in any of the holes HL1 and HL2, so that the difference in the hole width between the hole HL2 and the hole HL1 (difference H2b) is maintained constant and the film LA2 is etched. Therefore, the difference between the hole width of the hole HL2 and the hole width of the hole HL1 at the end of the section V21 is maintained as the difference H2b as at the start of the section V21.

The section V22 following the section V21 is removed after the entire film LA2 in the hole HL2 is removed by etching (from the end of the section V21) until the entire film LA2 in the hole HL2 is removed by etching (until the entire film LA2 is removed from the surface of the wafer W). In the section V22, since the film LA2 having a relatively high etching resistance is continuously etched in the hole HL2, and the film LA1 having a relatively low etching resistance is etched in the hole HL1, so that the etching in the hole HL1 is performed more quickly than the etching in the hole HL2. The entire film LA2 in the hole HL2 has been removed by etching at the end of the section V22. Therefore, in the section V22, the difference in the hole width between the hole HL2 and the hole HL1 becomes smaller with the progress of the etching. Also, the difference in the hole width between the hole HL2 and the hole HL1 at the end of the section V22 (difference H3b) is smaller than the difference in the hole width between the hole HL2 and the hole HL1 at the start of the section V22 (difference H2b).

The section V23 following the section V22 indicates the step in which the film LA1 is etched in the holes HL1 and HL2. Since the film LA1 is isotropically etched in any of the holes HL1 and HL2 in the section V22, the difference in the hole width between the hole HL2 and the hole HL1 (difference H3b) is maintained constant, while the film LA1 is etched. Therefore, the difference in the hole width between the hole HL2 and the hole HL1 at the end of the section V23 is maintained as the difference H3b as at the start of the section V23.

Descriptions will be made on the improvement of the variation in the hole width by executing the sequence SQ1 once using the step ST1 illustrated in FIG. 13. In the hole HL1, the film thickness WF2a of the film LA1 is denoted by K11, and the film thickness WF3a of the film LA2 is denoted by K12. In the hole HL2, the film thickness WF2b of the film LA1 is denoted by K21, and the film thickness WF3b of the film LA2 is denoted by K22. In the etching of the step ST2, it is assumed that the value of the etching rate of the film LA1 is R1 and the value of the etching rate of the film LA2 is R2. At the end point of the section V22 illustrated in FIG. 15 (at the time when the entire film LA2 is removed from the surface of the wafer W), the difference in the film thickness between the film LA2 formed on the inner surface of the hole HL2 and the film LA2 formed on the inner surface of the hole HL1 becomes K21−(K11−(R1/R2)×(K22−K12)). Therefore, the improvement amount of the local CD uniformity (LCDU) is (K21−K11)+(R1/R2)×(K22−K12). Since R1>R2, R1/R2>1. Thus, the above-described improvement amount becomes a value that is larger than the value obtained by simply adding the difference between the film thickness WF2b of the film LA1 in the hole HL2 and the film thickness WF2a of the film LA1 in the hole HL1 (K21−K11), and the difference between the film thickness WF3b of the film LA2 in the hole HL1 and the film thickness WF3a of the film LA2 in the hole HL1 (K21−K11). Therefore, an effective improvement against the reduction of the hole width variation is expected.

Further, when the value of the difference H1b illustrated in FIG. 15 (the value obtained by subtracting the value of the hole width WW1a in the hole HL1 before formation of the film LA from the value of the hole width WW1b in the hole HL2 before formation of the film LA) is assumed to be Δ, the value of the difference H3b illustrated in FIG. 15 becomes Δ−2×(K21−K11)−2×(R1/R2)×(K22−K12). Therefore, the difference in the hole width between the holes HL1 and HL2 after the execution of the sequence SQ1 is reduced by the hole width difference Δ1 of 2×(K21−K11)+2×(R1/R2)×(K22−K12) than the hole width difference Δ between the holes HL1 and HL2 before the execution of the sequence SQ1. Since Δ1 is larger than the value in a case where R1=R2, that is, the value in a case where the film LA is only a single layer, (2×(K21−K11)+2×(K22−K12)), when the step ST1 according to the modification (when the film LA includes two layers of the film LA1 and the film LA2) is used, the reduction of the variation in the hole width may be more effectively implemented by the execution of the sequence SQ1.

In the meantime, a step of forming a film LA that has two layers having different amounts of oxygen added (films LA1 and LA2) as illustrated in FIG. 12 has been exemplified as a step of forming the film LA having two layers (the modification of the step ST1). However, the present disclosure is not limited to this and may be configured such that two or more films such as, for example, a silicon-containing film, a boron-containing film, a metal film, and a carbon film are combined to have the same effect as the film LA having the film LA1 and the film LA2.

Figure 16:
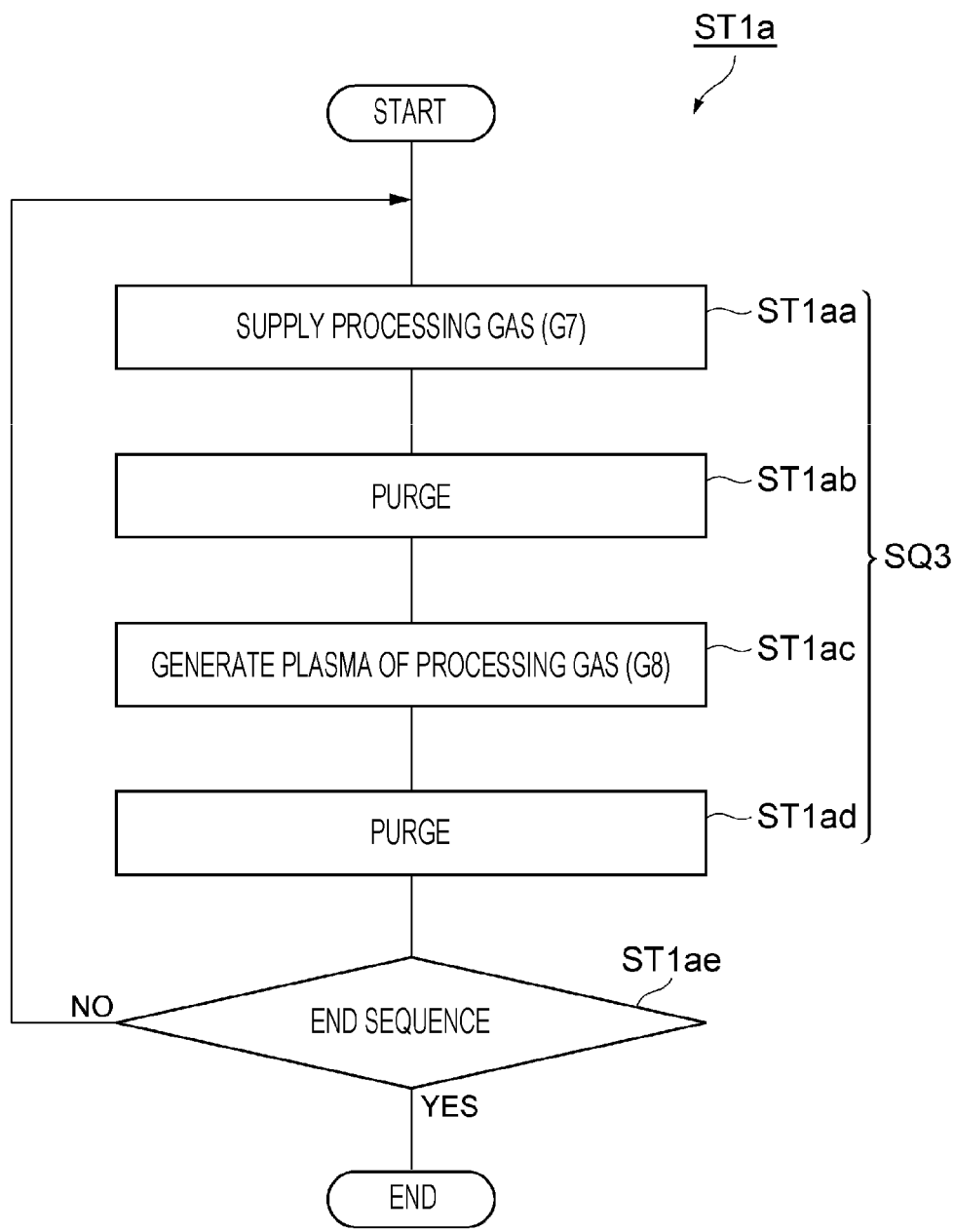
FIG. 16 is a flow chart illustrating another example of the film forming step illustrated in FIG. 13.
Figure 17A:
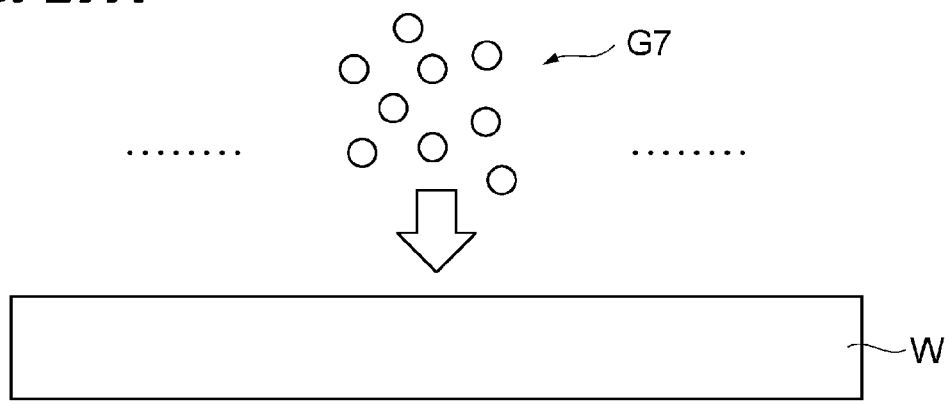
FIGS. 17A to 17C are views illustrating the principle of the film formation in the step illustrated in FIG. 16.
Figure 17B:
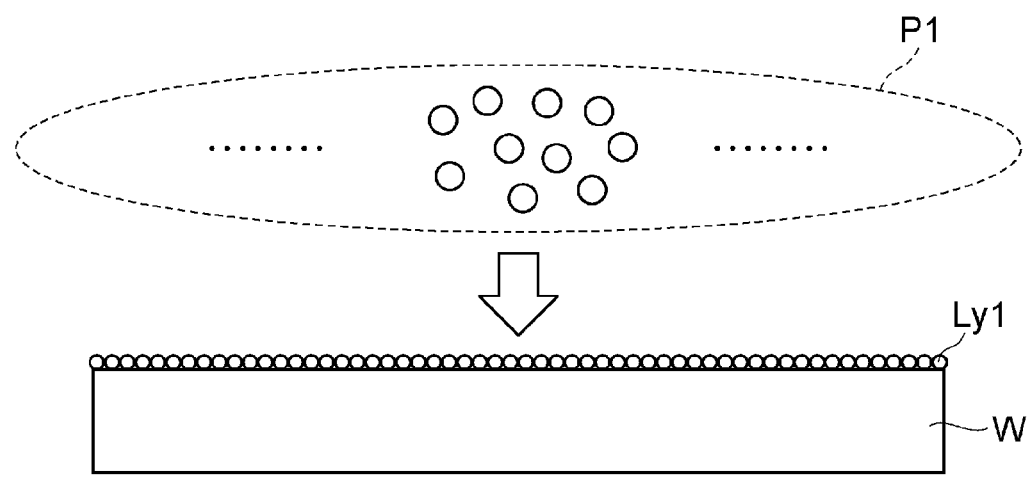
Figure 17C:
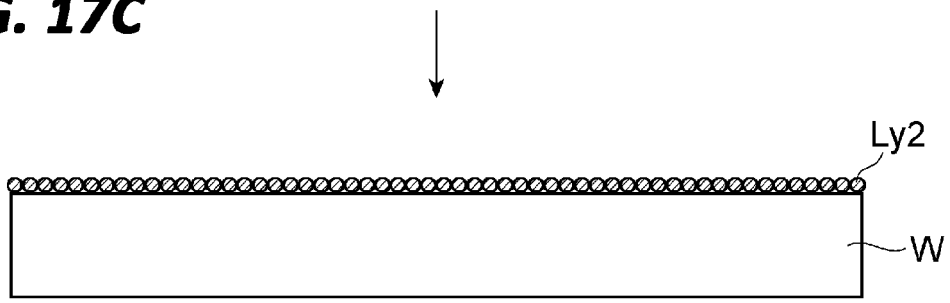

Further, although the plasma CVD method is used to form the film LA1 in the step ST1a, it is also possible to form the film LA1 on the surface of the wafer W (in particular, on the inner surface of the hole) in a conformal manner by the same method as the atomic layer deposition (ALD) method without being limited thereto. A method of forming the film LA1 by the same method as the ALD method in the step ST1a will be described with reference to FIG. 16 and FIGS. 17A to 17C. FIG. 16 is a flow chart illustrating another example of the step ST1a among the film forming steps illustrated in FIG. 13. FIGS. 17A to 17C are diagrams illustrating the principle of formation of the film LA1 in the step illustrated in FIG. 16.

The step ST1a includes a sequence SQ3 (third sequence) and a step ST1ae. A series of steps including the sequence SQ3 and the step ST1ae forms a film (film LA1) on the surface of the wafer W carried into the processing container 192 (the surface MK1 of the mask MK and the inner surface of the hole of the mask MK). The sequence SQ3 includes a step ST1aa (ninth step), a step ST1ab (tenth step), a step ST1ac (eleventh step), and a step ST1ad (twelfth step). In the step ST1aa, a processing gas G7 (third gas) is supplied into the processing container 192. Specifically, in the step ST1*aa*, the processing gas G7 containing silicon is introduced into the processing container 192 as illustrated in FIG. 17A.

The processing gas G7 includes an organic group-containing aminosilane-based gas. As the processing gas G7, an aminosilane-based gas having a molecular structure having a relatively small number of amino groups may be used, and for example, monoaminosilane ($H_3$—Si—R where R is an amino group which contains an organic group and may be substituted) may be used. Further, the aminosilane-based gas used as the processing gas G7 may include aminosilane having 1 to 3 silicon atoms or aminosilane having 1 to 3 amino groups. The aminosilane having 1 to 3 silicon atoms may be monosilane having 1 to 3 amino groups (monoaminosilane), disilane having 1 to 3 amino groups, or trisilane having 1 to 3 amino groups. In addition, the aminosilane may have an amino group which may be substituted. The amino groups may be substituted by any of methyl, ethyl, propyl, and butyl groups. Further, the methyl, ethyl, propyl, or butyl group may be substituted by halogen. The processing gas G7 of the organic group-containing aminosilane-based gas from the selected gas source of a plurality of gas sources of the gas supply source 122 is supplied into the processing container 192. The processing time in the step ST1*aa* is longer than the time taken to reach the self-control area of the ALD method.

The molecules of the processing gas G7 are attached to the surface of the wafer W (the surface MK1 of the mask MK and the inner surface of the hole of the mask MK) as a reaction precursor (layer Ly1) as illustrated in FIG. 17B. In the step ST1*aa*, the plasma of the processing gas G7 is not generated. The molecules of the processing gas G7 are attached to the surface of the wafer W by chemical adsorption based on chemical bonding, and no plasma is used. When the processing gas G7 may be attached to the surface of the wafer W by chemical bonding and contains silicon, such a gas may be used.

In the meantime, monoaminosilane is selected, for example, as the processing gas G7, because monoaminosilane has a relatively high electrical negativity and a polar molecular structure so that chemical adsorption may be performed relatively easily. A layer Ly1 of a reaction precursor formed by attaching the molecules of the processing gas G7 to the surface of the wafer W is in a state of being close to a monomolecular layer (monolayer) because the attachment is chemical adsorption. As the amino group (R) of the monoaminosilane becomes smaller, the molecular structure of the molecule attached to the surface of the wafer W becomes smaller, so that the steric hindrance caused by the molecular size is reduced. Thus, the molecules of the processing gas G7 may be uniformly attached to the surface of the wafer W, and the layer Ly1 may be formed with a uniform film thickness on the surface of the wafer W.

As described above, since the processing gas G7 contains an organic group-containing aminosilane-based gas, the reaction precursor of silicon (layer Ly1) is formed along the atomic layer on the surface of the wafer W by the step ST1*aa*.

In the step ST1*ab* following the step ST1*aa*, the processing space Sp in the processing container 192 is purged. Specifically, the processing gas G7 supplied in the step ST1*aa* is exhausted. In the step ST1*ab*, an inert gas such as a nitrogen gas or a rare gas (e.g., Ar) may be supplied as a purge gas into the processing container 192. That is, the purging of the step ST1*ab* may be either gas purging for causing an inert gas to flow into the processing container 192 or purging by vacuuming. In the step ST1*ab*, the molecules attached in an excessive amount to the surface of the wafer W may also be removed. Thus, the layer Ly1 of the reaction precursor becomes an extremely thin molecular layer formed on the surface of the wafer W.

In the step ST1*ac* following the step ST1*ab*, as illustrated in FIG. 17B, plasma P1 of a processing gas G8 (fourth gas) is generated in the processing space Sp of the processing container 192. The processing gas G8 includes a gas containing an oxygen atom, and may include, for example, an oxygen gas. The processing gas G8 including the gas containing an oxygen atom is supplied from the selected gas source of a plurality of gas sources of the gas supply source 122 into the processing container 192. Then, a high frequency power is supplied from the high-frequency power source 150A and the high-frequency power source 150B. The pressure of the processing space Sp in the processing container 192 is set to a preset pressure by operating the exhaust device 50. In this manner, the plasma P1 of the processing gas G8 is generated in the processing space Sp.

As illustrated in FIG. 17B, when the plasma P1 of the processing gas G8 is generated, an active species of oxygen, for example, an oxygen radical, is generated. Further, as illustrated in FIG. 17C, a layer Ly2 which is a silicon oxide film (a layer included in the film LA1 illustrated in FIG. 12) is formed as an extremely thin molecular layer.

As described above, since the processing gas G8 includes oxygen atoms, the oxygen atom are bonded to the reaction precursor of the silicon (layer Ly1) formed on the surface of the wafer W in the step ST1*ac*, so that the layer Ly2 of a silicon oxide film may be formed on the surface of the wafer W. Therefore, in the sequence SQ3, the layer Ly2 of the silicon oxide film may be formed on the surface of the wafer W by the same method as the ALD method.

The processing space Sp in the processing container 192 is purged in the step ST1*ad* following the step ST1*ac*. Specifically, the processing gas G8 supplied in the step ST1*ac* is exhausted. In the step ST1*ad*, an inert gas such as a nitrogen gas or a rare gas (e.g., Ar) may be supplied as a purge gas into the processing container 192. That is, the purging of the step ST1*ad* may be either gas purging for causing an inert gas to flow into the processing container 192 or purging by vacuuming.

In the step ST1*ae* following the sequence SQ3, it is determined whether the number of repetitions of the sequence SQ3 has reached a preset number. When it is determined that the number of repetitions has not been reached ("NO" in the step ST1*ae*), the sequence SQ3 is executed again. When it is determined that the number of repetitions has been reached ("YES" in the step ST1*ae*), the process proceeds to the step ST1*b*. That is, in the step ST1*ae*, the execution of the sequence SQ3 is repeated to form the film LA1 on the surface of the wafer W until the number of repetitions of the sequence SQ3 reaches the preset number. The number of repetitions of the sequence SQ3 controlled by the step ST1*ae* is set so that a hole having the smallest hole width among a plurality of holes formed on the surface of the wafer W has a larger hole width than the preset reference width, without being occluded by the film LA1 formed by the sequence SQ3 or the like (furthermore, the film LA2 formed by the step ST1*b*) (while at least the hole opening is not occluded).

In this manner, when the film LA1 is formed in a conformal manner by the same method as the ALD method in the step ST1*a*, the film LA1 is formed in a conformal manner on the surface of the wafer W (especially, on the inner surface of the hole) by repeatedly executing the sequence SQ3 that includes: the step ST1aa of first forming a reaction precursor containing silicon (layer Ly1) on the surface of the wafer W (especially, the inner surface of the hole) using an aminosilane-based gas without using plasma; and the step ST1ac of forming a thin film containing a silicon oxide (layer Ly2) by bonding an oxygen atom to the reaction precursor using the plasma of a gas containing an oxygen atom.

As described above, in the method MT according to the embodiment, the step ST1 includes a film forming process using the plasma CVD method. Therefore, the film LA having a relatively thin film thickness is formed with respect to the hole HL1 having a relatively narrow hole width and the film LA having a relatively thick film thickness is formed with respect to the hole HL2 having a relatively wide hole width. Therefore, even when the hole width varies in a plurality of holes, the variation may be reduced by the film forming process in the step ST1. Further, since the film LA formed by the step ST1 is isotropically etched in the step ST2, the film LA formed in the step ST1 may cause the hole width to be adjusted while maintaining the hole width reduced.

In addition, since the sequence SQ1 is executed repeatedly, the film having the finally desired film thickness may be formed by forming the film having a relatively thin film thickness (a film included in the film LA) in the step ST1, and repeatedly executing the sequence SQ1. Thus, it is possible to sufficiently avoid the situation that the opening of the hole HL1 is occluded by the film formed by the step ST1 in the hole HL1 having a relatively narrow hole width.

The surface of the film LA formed in the step ST1 is isotropically modified by the method similar to the ALE method as in the step ST2 illustrated in FIG. 7, and a mixed layer MX is entirely removed after the mixed layer MX is isotropically formed on the surface of the film. Thus, the film LA formed in the step ST1 may be isotropically and uniformly removed by the etching performed in the step ST2.

Even when the film LA2 is removed in the step ST2 in the hole HL1 in which a relative thin film is formed in the step ST1 due to a relatively narrow hole width, a portion of the film LA2 may remain in the hole HL2 in which a relatively thick film is formed in the step ST1 due to a relatively wide hole width. When etching is continuously performed in the step ST2 from this state, the etching resistance of the film LA1 is lower than the etching resistance of the film LA2, so that the etching of the hole HL1 is performed faster than that of the hole HL2. Therefore, the variation in the hole width between the hole HL1 and the hole HL2 may be more effectively reduced using the film LA1 having a relatively low etching resistance and the film LA2 having a relatively high etching resistance.

Since the film LA1 is formed by the same method as the ALD method as in the step ST1a illustrated in FIG. 16, the film LA1 having a relatively thin film thickness may be formed in a conformal manner in the step ST1a. Therefore, even when the film LA2 is formed by the plasma CVD method, the entire film thickness of the film LA including the film LA1 and the film LA2 may be effectively controlled.

In the above embodiment, the films LA1 and LA2 are described as silicon-containing films. However, the present disclosure is not limited thereto. The films LA1 and LA2 are films other than the silicon-containing films, and may be formed by the plasma CVD on the inner surface of the hole and may be etched isotropically. Further, the etching resistance for the etching performed in the step ST2 may be lower in the film LA1 than the film LA2. For example, the films LA1 and LA2 may be any of a silicon-containing film, a boron-containing film, a metal film, and a carbon-containing film.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A method of processing a workpiece comprising:
providing a workpiece which includes a plurality of holes formed on a surface of the workpiece, wherein the plurality of holes include a small diameter hole and a large diameter hole having a diameter larger than the small diameter hole, and wherein the workpiece has an initial size difference which is a difference between the diameters of the large diameter hole and the small diameter hole;
performing a first sequence on the workpiece, the first sequence including:
a first process of forming a film on an inner surface of each of the plurality of holes and wherein the first process includes forming the film with a thickness on the inner surface of the small diameter hole which is smaller than a thickness of the film formed on the inner surface of the large diameter hole; and
a second process of isotropically etching the film, and during the second process the film of the small diameter hole is etched to a small hole film inner diameter and the film of the large diameter hole is etched to a large hole film inner diameter, and wherein the workpiece has a post-etch size difference which is a difference between the large hole film inner diameter and the small hole film inner diameter, and after the isotropically etching the post-etch size difference is smaller than the initial size difference, and
wherein the first process includes a film forming process using a plasma CVD method, and the film contains silicon.

2. The method of claim 1, wherein the first sequence is repeatedly executed.

3. The method of claim 1, further including repeating the first sequence and in each sequence the post-etch size difference is smaller than the initial size difference such that size differences between the large hole and the small hole progressively become smaller as the first sequence is repeated.

4. A method of processing a workpiece with a plurality of holes formed on a surface thereof, the method comprising:
a first sequence including:
a first process of forming a film with respect to an inner surface of each of the holes; and
a second process of isotropically etching the film,
wherein in the second process, the film is isotropically etched by removing the film for each atomic layer by repeatedly executing a second sequence, and each execution of the second sequence includes:
generating plasma of a first gas which includes nitrogen within a processing container of a plasma processing apparatus in which the workpiece is accommodated, and isotropically forming a mixed layer that includes an ion included in the plasma of the first gas in the atomic layer of the inner surface of the hole, and wherein the mixed layer includes silicon nitride;

a first purging step of purging a space within the processing container after generating the plasma of the first gas and isotropically forming the mixed layer;

after the first purging step, generating plasma of a second gas which includes fluorine within the processing container and removing the mixed layer including silicon nitride by radicals included in the plasma of the second gas; and after generating the plasma of the second gas and removing the mixed layer including silicon nitride, a second step of purging the space within the processing container.

5. The method of claim 4, wherein the second gas is a mixed gas including $NF_3$ gas and $O_2$ gas.

6. The method of claim 4, wherein the second gas is a mixed gas including $NF_3$ gas, $O_2$ gas, $H_2$ gas, and Ar gas.

7. The method of claim 4, wherein the second gas is a mixed gas including $CH_3F$ gas, $O_2$ gas, and Ar gas.

8. The method of claim 4, wherein during the generating the plasma with the gas which includes nitrogen, the process container is at a pressure of 200 mTorr or more, and an atomic layer surface of the film is modified by nitrogen ions of the plasma to form a modified atomic layer surface, wherein the modified atomic layer surface includes the silicon nitride and the modified atomic layer surface is removed with the plasma of the second gas which includes fluorine.

9. The method of claim 8, wherein a process time of the generating the plasma with the gas which includes nitrogen exceeds a self-control process time such that forming of the modified atomic layer surface is uniformly performed regardless of hole size.

10. A method of processing a workpiece with a plurality of holes formed on a surface thereof, the method comprising:

a first sequence including:
a first process of forming a film with respect to an inner surface of each of the holes; and
a second process of isotropically etching the film,
wherein the first process includes forming a first film on the inner surface of the hole; and forming a second film on the first film, and the second process of isotropically etching is performed after the second film is formed, and wherein during etching performed in the second process an etching resistance is lower for the first film than an etching resistance for the second film.

11. The method of claim 10, wherein the first film is formed by repeatedly executing a first film forming sequence including:

supplying a gas which includes an aminosilane-based gas to a processing container of a plasma processing apparatus in which the workpiece is accommodated without generating a plasma, a first purging step of purging a space within the processing container after supplying the gas which includes an aminosilane-based gas;

generating plasma of a gas which includes oxygen within the processing container after the first purging step; and a second purging step of purging the space within the processing container after the generating plasma with the gas which includes oxygen; and wherein the second film is formed with a plasma CVD process.

12. The method of claim 11, wherein the gas which includes an aminosilane-based gas includes monoaminosilane.

13. The method of claim 11, wherein the aminosilane-based gas includes aminosilane having one to three silicon atoms.

14. The method of claim 11, wherein the aminosilane-based gas includes aminosilane having one to three amino groups.

15. The method of claim 10, wherein a composition of the first film is different than a composition of the second film.

16. The method of claim 15, wherein the first and second films have different oxygen contents.

17. The method of claim 15, wherein the second film has a higher oxygen content than the first film.

18. The method of claim 15, wherein the first and second films are each selected from a silicon-containing film, a boron-containing film, a metal film, and a carbon-containing film.

* * * * *